US006753608B2

(12) United States Patent
Tomita

(10) Patent No.: US 6,753,608 B2
(45) Date of Patent: Jun. 22, 2004

(54) SEMICONDUCTOR DEVICE WITH SEAL RING

(75) Inventor: Kazuo Tomita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/360,799

(22) Filed: Feb. 10, 2003

(65) Prior Publication Data

US 2004/0026785 A1 Feb. 12, 2004

(30) Foreign Application Priority Data

Aug. 12, 2002  (JP) ........................................ 2002-234387

(51) Int. Cl.[7] .............................................. H01L 23/48
(52) U.S. Cl. ...................... 257/758; 257/620; 257/127; 438/624
(58) Field of Search ................................ 257/620, 127, 257/787, 750, 758–759, 760, 762, 774; 438/620, 624, 652, 687, 629, 637, 639, 640

(56) References Cited

U.S. PATENT DOCUMENTS

| 5,652,459 | A | * | 7/1997 | Chen ........................... 257/529 |
| 5,861,658 | A | * | 1/1999 | Cronin et al. ................. 257/499 |
| 5,891,808 | A | * | 4/1999 | Chang et al. ................. 438/740 |
| 5,926,697 | A | * | 7/1999 | Yaung et al. ................. 438/132 |
| 5,990,537 | A | * | 11/1999 | Endo et al. ................... 257/529 |
| 5,994,762 | A | * | 11/1999 | Suwanai et al. ............. 257/620 |
| 6,251,786 | B1 |  | 6/2001 | Zhou et al. |
| 6,255,715 | B1 | * | 7/2001 | Liaw ........................... 257/529 |
| 6,294,400 | B1 | * | 9/2001 | Stewart et al. ................ 438/52 |
| 6,300,223 | B1 | * | 10/2001 | Chang et al. ................. 438/460 |
| 6,313,900 | B1 | * | 11/2001 | Kawata ....................... 349/153 |
| 6,376,899 | B1 | * | 4/2002 | Seshan et al. ............... 257/620 |
| 6,424,051 | B1 | * | 7/2002 | Shinogi et al. ............. 257/787 |
| 6,451,681 | B1 | * | 9/2002 | Greer .......................... 438/601 |
| 6,492,716 | B1 | * | 12/2002 | Bothra et al. ............... 257/678 |
| 6,525,398 | B1 | * | 2/2003 | Kim et al. ................... 257/529 |
| 6,537,849 | B1 | * | 3/2003 | Tsai et al. .................... 438/106 |
| 6,566,736 | B1 | * | 5/2003 | Ogawa et al. .............. 257/620 |
| 6,573,538 | B2 | * | 6/2003 | Motsiff et al. .............. 257/127 |
| 6,617,664 | B2 | * | 9/2003 | Hayashi et al. ............. 257/529 |
| 2002/0004932 | A1 | * | 1/2002 | Shau ........................... 716/19 |
| 2003/0160261 | A1 | * | 8/2003 | Moriya ....................... 257/127 |

FOREIGN PATENT DOCUMENTS

JP          2001-176879          6/2001

* cited by examiner

Primary Examiner—Long Pham
Assistant Examiner—Thao X Le
(74) Attorney, Agent, or Firm—Oblon, Spivak, McClelland, Maier & Neustadt, P.C.

(57) ABSTRACT

It is intended to prevent a crack from occurring in a circuit region during dicing, while preventing oxidation and corrosion of a seal ring including a layer of copper as the uppermost layer thereof.

A passivation film (120) has an opening (123) formed therein, The opening (123) is formed so as to reach an interlayer insulating film (109) and disposed so as to surround a periphery of a seal ring (110). As a result, a top face of a second interconnect layer (114) is completely covered by the passivation film (120), and is not exposed to an ambient air. Hence, it is possible to prevent an effect of protecting a semiconductor device achieved by the seal ring (110) from being reduced due to oxidation and corrosion of the second interconnect layer (114). Further, provision of the opening (123) does not allow a stress generated at a time of cutting a dicing region during dicing to easily propagate to a portion of the passivation film (120) present on the circuit region. This prevents occurrence of a crack in the circuit region.

2 Claims, 24 Drawing Sheets

F I G. 1
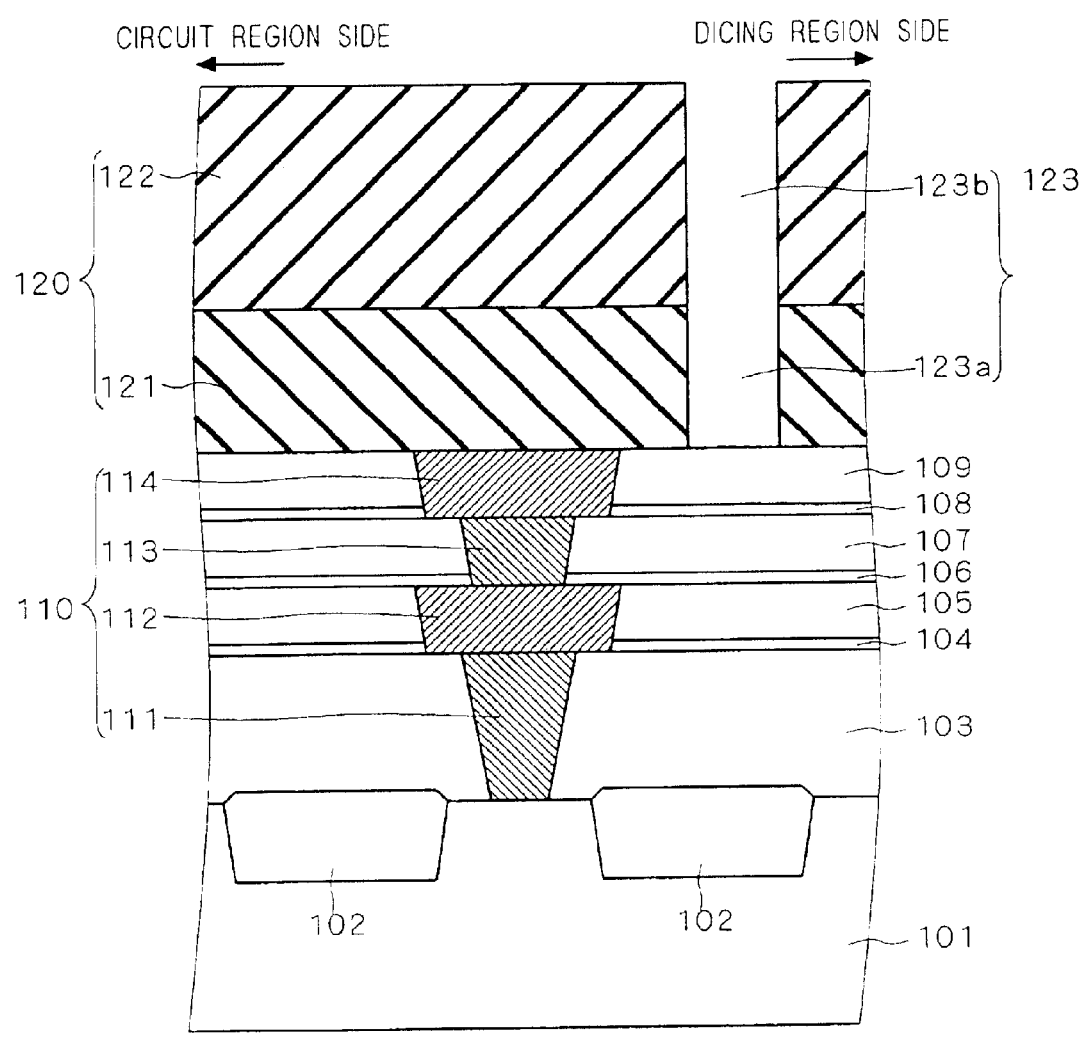

SEMICONDUCTOR DEVICE WITH SEAL RING

BACKGROUND OF THE INVENTION

1. Field of the Invention

The present invention relates to a passivation film and a seal for an edge of a die which serve as a protective structure for a semiconductor device.

2. Description of the Background Art

In order to protect a region in which a circuit is formed (hereinafter, referred to as a "circuit region") in a semiconductor device from influences of moisture and ions contained in an ambient air, a protective structure called a "die edge seal", "guard ring" or "seal ring" is provided on an inner side of a dicing line, that is, in the vicinity of an edge portion of a chip (die). A typical seal ring is formed of interconnect layers and contacts made of materials in the same manner as a circuit region in a semiconductor device, and surrounds the circuit region. Further, a protective film called a "passivation film" is provided on a surface of the semiconductor device to function to protect the surface of the semiconductor device, keeping the surface of the semiconductor device away from influences of an ambient air.

In recent days, a semiconductor device has been structurally further miniaturized, and an integration density as well as an operation speed thereof has been further increased. Under such a condition, higher importance has been placed on reduction of interconnect resistance. As a result, copper (Cu) having a relatively low resistance has been more frequently utilized as a material for interconnects. Accordingly, copper has been utilized also to form the above-mentioned seal ring in more instances.

FIG. 29 is a view illustrating a structure of a conventional semiconductor device, more particularly, is an enlarged view of an area of the conventional semiconductor device in which a seal ring is formed. As described above, a seal ring is typically formed on an inner side of a dicing line. The area illustrated in FIG. 29 includes a circuit region on the left-hand side of the drawing and includes a dicing region (a region to be cut during dicing) on the right-hand side of the drawing. It is noted that circuit elements of the semiconductor device are omitted in FIG. 29.

Referring to FIG. 29, a seal ring 110 includes a first contact 111, a first interconnect layer 112, a second contact 113 and a second interconnect layer 114. On a silicon substrate 101 having an isolation film 102 formed therein, an interlayer insulating film 103 having the first contact 111 formed therein, an interlayer insulating film 105 having the first interconnect layer 112 made of copper formed therein, an interlayer insulating film 107 having the second contact 113 formed therein and an interlayer insulating film 109 having the second interconnect layer 114 made of copper formed therein are formed. Further, etch stop layers 104, 106 and 108 are formed between the interlayer insulating films 103 and 105, the interlayer insulating films 105 and 107, and the interlayer insulating films 107 and 109, respectively.

Each of the first and second contacts 111 and 113 is made of tungsten (W), for example, while each of the interlayer insulating films 103, 105, 107 and 109 is made of plasma oxide, for example. Each of the etch stop layers 104, 106 and 108 is made of plasma nitride, for example.

Moreover, a passivation film 120 is formed on the uppermost interlayer insulating film. In an instance illustrated in FIG. 29, the passivation film 120 has a bilayer structure composed of a layer of plasma nitride (plasma nitride layer) 121 and a polyimide layer 122.

Because of provision of the seal ring 110 and the passivation film 120, the circuit region of the semiconductor device is protected from influences of moisture and ions contained in an ambient air, which makes it possible to ensure stability of properties of the semiconductor device over a long period of time.

Also, the seal ring 110 produces a further effect of preventing a crack from occurring in the circuit region at a time of cutting the dicing region during dicing. A crack which possibly occurs in the dicing region during dicing is prevented from propagating from the dicing region to the circuit region, because of provision of the seal ring 110 between the dicing region and the circuit region.

In the conventional semiconductor device, the passivation film 120 is formed only on one side of the seal ring 110 where the circuit region is provided (a circuit region side). Accordingly, on the other side where the dicing region is provided (a dicing region side), a top face of the interlayer insulating film 109 is exposed. Such configuration is employed in the conventional semiconductor device for the following reasons. If the passivation film 120 is formed on an entire surface of a wafer including the dicing region, a stress (or a crack) occurring in the dicing region due to a process of cutting the dicing region during dicing can easily propagate through the passivation film 120 to the circuit region, so that a crack is more likely to occur in the circuit region.

For the foregoing reasons, the conventional semiconductor device employs a configuration in which a top face of the uppermost layer of the seal ring 110, i.e., the second interconnect layer 114, is exposed as illustrated in FIG. 29. Accordingly, the top face of the second interconnect layer 114 is exposed to an ambient air in the conventional semiconductor device. When the uppermost layer of the seal ring 110, i.e., the second interconnect layer 114, is made of copper as in the instance of FIG. 29, the foregoing conventional configuration disadvantageously results in oxidation and corrosion of the second interconnect layer 114 because copper is more easily to be oxidized and corroded than other kinds of metal as a material for interconnects (such as aluminum). This invites reduction of the effect of protecting the semiconductor device which is achieved by the seal ring 110.

SUMMARY OF THE INVENTION

It is an object of the present invention to provide a semiconductor device capable of preventing a crack from occurring in a circuit region during dicing, while preventing a seal ring from being oxidized and corroded.

According to a first aspect of the present invention, a semiconductor device includes a seal ring and a passivation film. The seal ring is formed in an interlayer insulating film in the vicinity of an edge portion of a semiconductor chip, and surrounds a circuit region of the semiconductor chip. The passivation film is formed above the seal ring so as to cover a surface of the semiconductor chip, and has a first opening reaching a top face of the interlayer insulating film. Further, a top face of an uppermost layer of the seal ring is covered with the passivation film.

The top face of the uppermost layer of the seal ring portion is not exposed to an ambient air. Accordingly, even if copper, for example, is employed as a material for the uppermost layer of the seal ring, it is possible to prevent an effect of protecting the semiconductor device achieved by the seal ring from being reduced due to oxidation and corrosion of the uppermost layer. Further, because of provision of a region not including the passivation film, a stress generated at a time of cutting a dicing region during dicing can not easily propagate to a portion of the passivation film which is present on a circuit region. Hence, it is possible to prevent a crack from occurring in the circuit region.

According to a second aspect of the present invention, a semiconductor device includes a seal ring, an aluminum interconnect layer and a passivation film. The seal ring is formed in an interlayer insulating film in the vicinity of an edge portion of a semiconductor chip, and surrounds a circuit region of the semiconductor chip. The aluminum interconnect layer is formed on the seal ring. The passivation film is formed above the seal ring so as to cover a surface of the semiconductor chip, and has a first opening reaching a top face of the interlayer insulating film. Further, a top face of an uppermost layer of the seal ring is covered with the aluminum interconnect layer.

The top face of the uppermost layer of the seal ring is not exposed to an ambient air. Also, even if the aluminum interconnect layer is exposed in a region not including the passivation film, it is still possible to prevent reduction of the effect of protecting the semiconductor device achieved by the seal ring because aluminum is relatively resistant to oxidation and corrosion. Thus, the structure of the semiconductor device according to the second aspect of the present invention is effective in a situation where a high alignment accuracy can not be ensured or another situation where a space for forming a region not including the passivation film can not be obtained between a dicing region and the seal ring.

According to a third aspect of the present invention, a semiconductor device includes a seal ring, a first passivation film, an aluminum interconnect layer and a second passivation film. The seal ring is formed in the vicinity of an edge portion of a semiconductor chip so as to surround a circuit region of the semiconductor chip. The first passivation film is formed above the seal ring so as to cover a surface of the semiconductor chip, and has a first opening reaching a top face of an uppermost layer of the seal ring. The aluminum interconnect layer is formed in the first opening. The second passivation film is formed so as to cover the first passivation film and the aluminum interconnect layer, and has an etch selectivity relative to the first passivation film. Further, the second passivation film has a second opening reaching a top face of the first passivation film.

Since the aluminum interconnect layer is formed in the first opening of the first passivation film, the top face of the uppermost layer of the seal ring is not exposed to an ambient air. Also, even if the second opening is formed above the uppermost layer of the seal ring, the uppermost layer of the seal ring is not exposed because of provision of the aluminum interconnect layer. Further, there is no need to form the aluminum interconnect layer so as to have a width larger than that of the uppermost layer of the seal ring, thereby to contribute to miniaturization of the device. Moreover, the second passivation film has the second opening by which the top face of the first passivation film is exposed. This does not allow a stress generated at a time of cutting a dicing region during dicing to easily propagate to a portion of the passivation film which is present on a circuit region. As a result, it is possible to prevent a crack from occurring in the circuit region.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view illustrating a structure of a semiconductor device according to a first preferred embodiment.

DESCRIPTION OF THE PREFERRED EMBODIMENTS

First Preferred Embodiment

Figure 29:
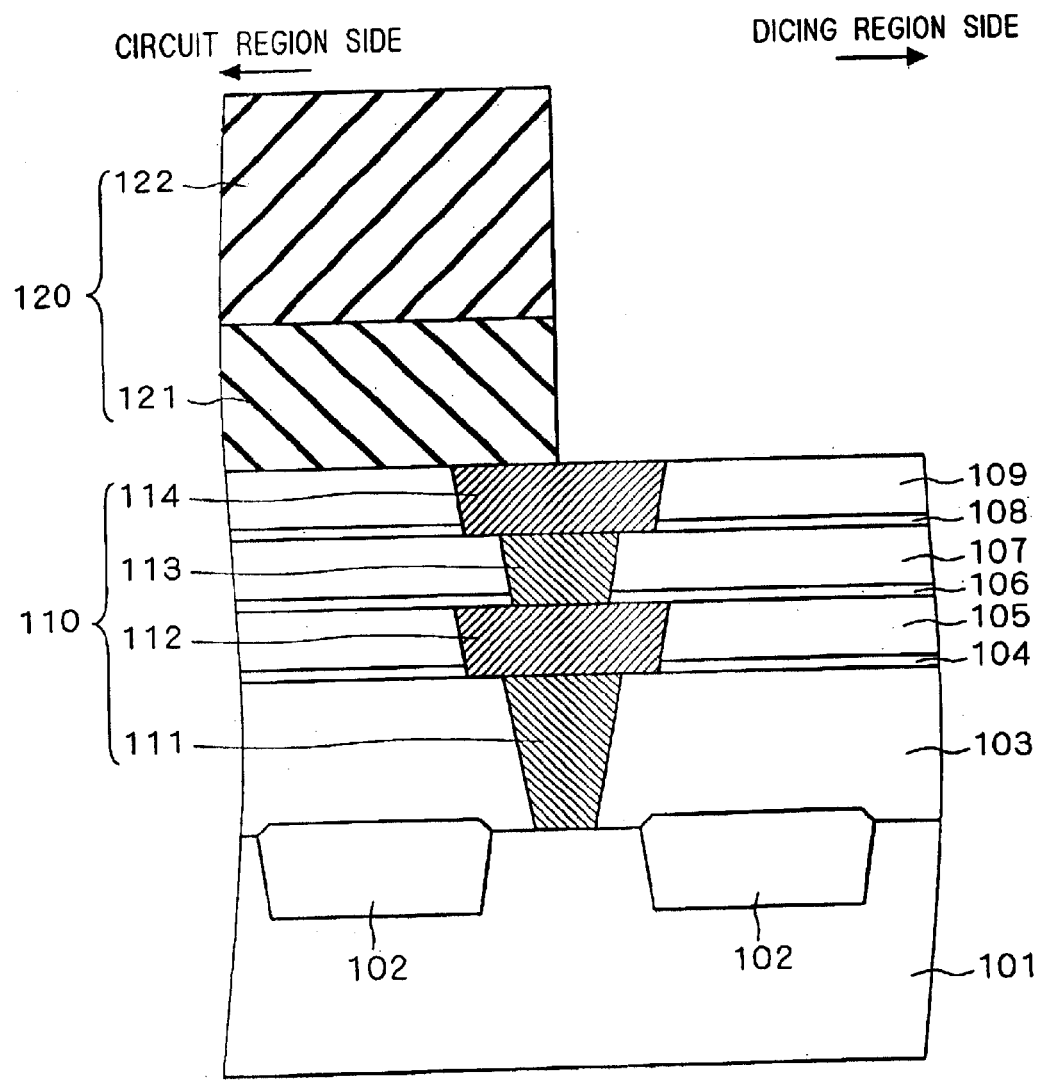
FIG. 29 is a view illustrating a structure of a conventional semiconductor device.

FIG. 1 is a view illustrating a structure of a semiconductor device according to a first preferred embodiment, and more particularly, is an enlarged view of an area of the semiconductor device in which a seal ring is formed. In FIG. 1, the same elements as those in FIG. 29 are indicated by the same reference numerals, and detailed description therefor will be omitted in the following description. It is noted that the area illustrated in FIG. 1 includes a circuit region (a region where a circuit is to be formed) on the left-hand side of the drawing and includes a dicing region (a region to be cut during dicing) on the right-hand side of the drawing in the same manner as in FIG. 29. It is further noted that each of first and second interconnect layers 112 and 114 is made of copper.

According to the first preferred embodiment, a passivation film 120 has an opening 123 formed therein. The opening 123 is composed of an opening 123a in a layer of plasma nitride (plasma nitride layer) 121 and an opening 123b of a polyimide layer 122, and reaches an interlayer insulating film 109. The passivation film 120 is completely absent in the opening 123. In other words, the opening 123 is a region not including the passivation film 120.

The opening 123 has a shape of a slit and is disposed so as to surround a periphery of a seal ring 110. In other words, the opening 123 and the top face of the second interconnect layer 114 are not aligned with each other with the opening 123 being placed on an outer side where the dicing region is provided (a dicing region side) in a chip. Accordingly, the top face of the second interconnect layer 114 is completely covered by the passivation film 120, so that the top face of the second interconnect layer 114 is not exposed to an ambient air. Hence, it is possible to prevent an effect of protecting the semiconductor device achieved by the seal ring 110 from being reduced due to oxidation and corrosion of the second interconnect layer 114.

Further, provision of the opening 123 does not allow a stress generated at a time of cutting the dicing region during dicing to easily propagate to a portion of the passivation film 120 which is present on the circuit region. Hence, it is possible to prevent a crack from occurring in the circuit region.

FIGS. 2 through 7 are views for illustrating processes of manufacturing the semiconductor device illustrated in FIG. 1. Below, the processes of manufacturing the semiconductor device according to the first preferred embodiment will be described with reference to those figures.

Figure 2:
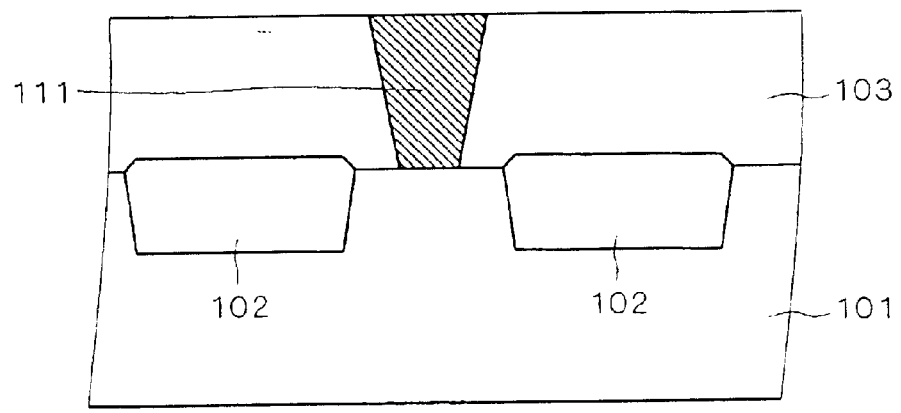
FIGS. 2 through 7 are views for illustrating processes of manufacturing the semiconductor device according to the first preferred embodiment.

First, a trench isolation (an isolation film 102) with a thickness of 300 nm, for example, is formed in a silicon substrate 101 by an STI (Shallow Trench Isolation) process. Next, an HDP (high density plasma) oxide film is deposited to a thickness of 1000 nm, for example, and is polished to be removed by 300 nm by a CMP (Chemical Mechanical Polishing) process, to form an interlayer insulating film 103. Then, dry etching is performed on the formed interlayer insulating film 103 using a resist mask having patterns of 0.10 μm in diameter, for example, to form an opening used for forming a first contact 111. At that time, the dry etching is performed with an adequate etch selectivity of the interlayer insulating film 103 relative to the silicon substrate 101. Subsequently, a barrier metal (not shown) is formed of TiN and Ti each of which is deposited to a thickness of 20 nm, for example, by a CVD (Chemical Vapor Deposition) process, and thereafter, tungsten as a material for the first contact 111 is deposited by a CVD process. Then, respective portions of the tungsten and the barrier metal which are present on the interlayer insulating film 103 are removed by a CMP process, to complete the first contact 111 (FIG. 2).

Figure 3:
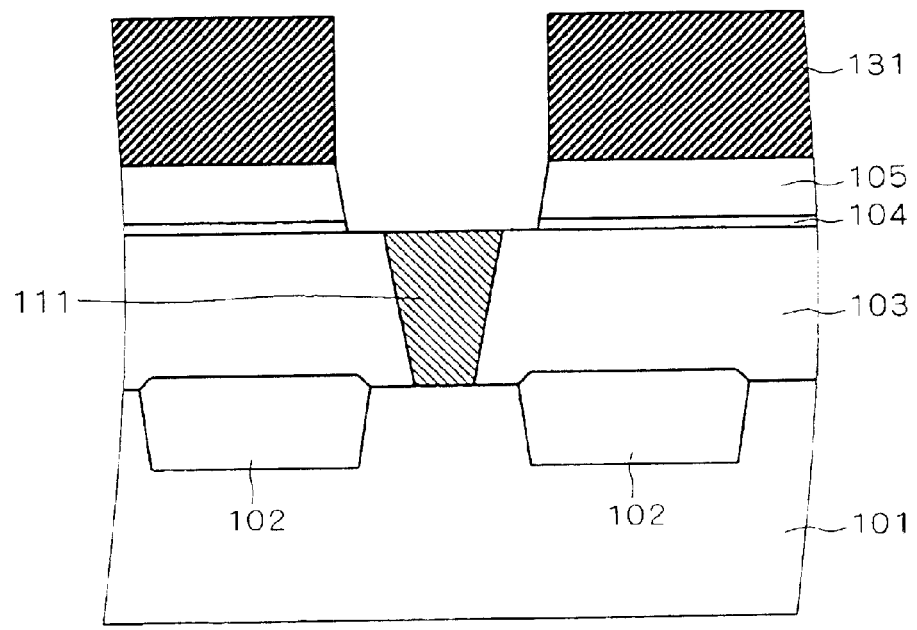

Next, plasma nitride is deposited to a thickness of 50 nm, for example, to form an etch stop layer 104. Further, plasma oxide is deposited to a thickness of 400 nm, and is polished to be removed by 200 nm by a CMP process, to form an interlayer insulating film 105. Then, dry etching is performed on the interlayer insulating film 105 using a resist mask 131 as a mask, to form an opening used for forming the first interconnect layer 112 (FIG. 3).

The resist mask 131 is removed, and thereafter, films of TaN and Ta each having a thickness of 10 nm is formed by a sputtering process, to form a barrier metal (not shown). Subsequently, copper as a material for the first interconnect layer 112 is deposited to a thickness of 400 nm by a plating process. Then, respective portions of the copper and the barrier metal which are present on the interlayer insulating film 105 are removed by a CMP process, to complete the first interconnect layer 112.

Further, plasma nitride is deposited to a thickness of 50 nm, for example, to form an etch stop layer 106. Subsequently, plasma oxide is deposited to a thickness of 400 nm, for example and is polished to be removed by 200 nm by a CMP process, to form an interlayer insulating film 107. Then, dry etching is performed on the formed interlayer insulating film 107 using a resist mask having patterns of 0.10 μm in diameter, for example, to form an opening used for forming a second contact 113. Subsequently, a barrier metal (not shown) is formed of TiN and Ti each of which is deposited to a thickness of 20 nm, for example, by a CVD (Chemical Vapor Deposition) process, and thereafter, tungsten as a material for the second contact 113 is deposited to a thickness of 200 nm by a CVD process. Then, respective portions of the tungsten and the barrier metal which are present on the interlayer insulating film 107 are removed by a CMP process, to complete the second contact 113.

Figure 4:
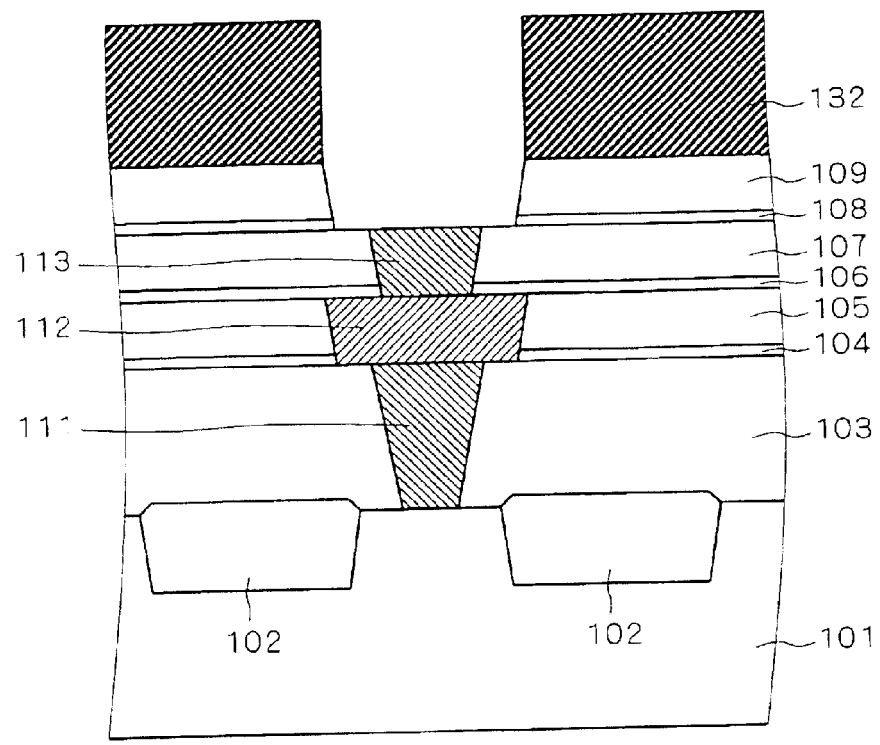

Next, plasma nitride is deposited to a thickness of 30 nm, for example, to form an etch stop layer 108. Further, plasma oxide is deposited to a thickness of 400 nm, and is polished to be removed by 200 nm by a CMP process, to form an interlayer insulating film 109. Then, dry etching is performed on the interlayer insulating film 109 using a resist mask 132 as a mask, to form an opening used for forming the second interconnect layer 114 (FIG. 4).

Figure 5:
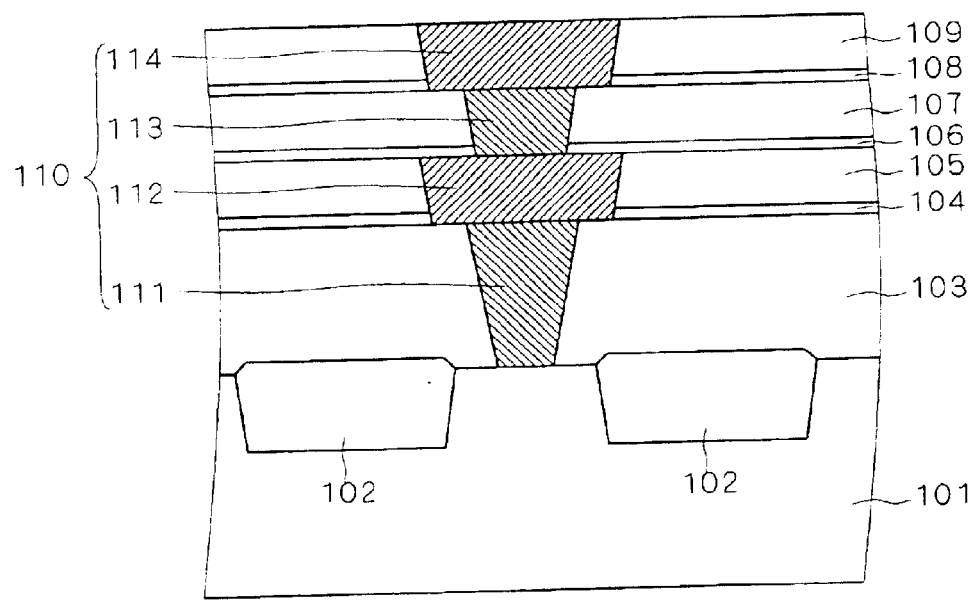

The resist mask 132 is removed, and thereafter, films of TaN and Ta each having a thickness of 10 nm is formed by a sputtering process, to form a barrier metal (not shown). Subsequently, copper as a material for the second interconnect layer 114 is deposited to a thickness of 400 nm by a plating process. Then, respective portions of the copper and the barrier metal which are present on the interlayer insulating film 109 are removed by a CMP process, to complete the second interconnect layer 114 (FIG. 5). By the foregoing processes, the seal ring 110 is completed.

Figure 6:
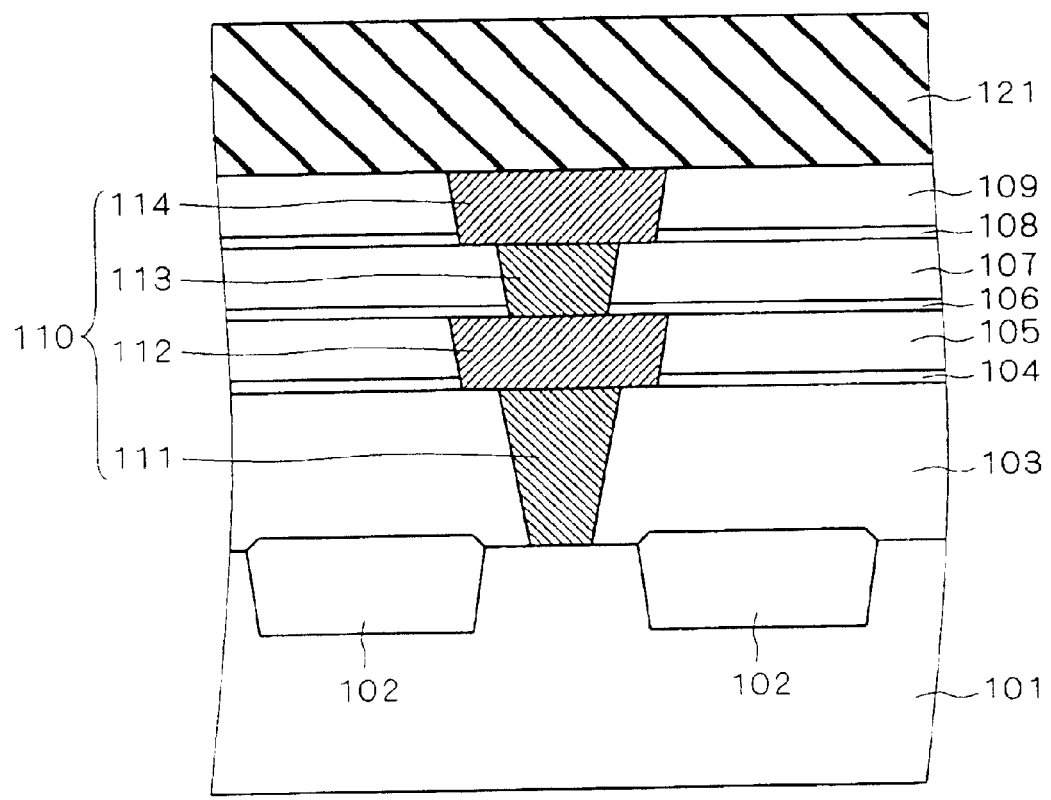
Figure 7:
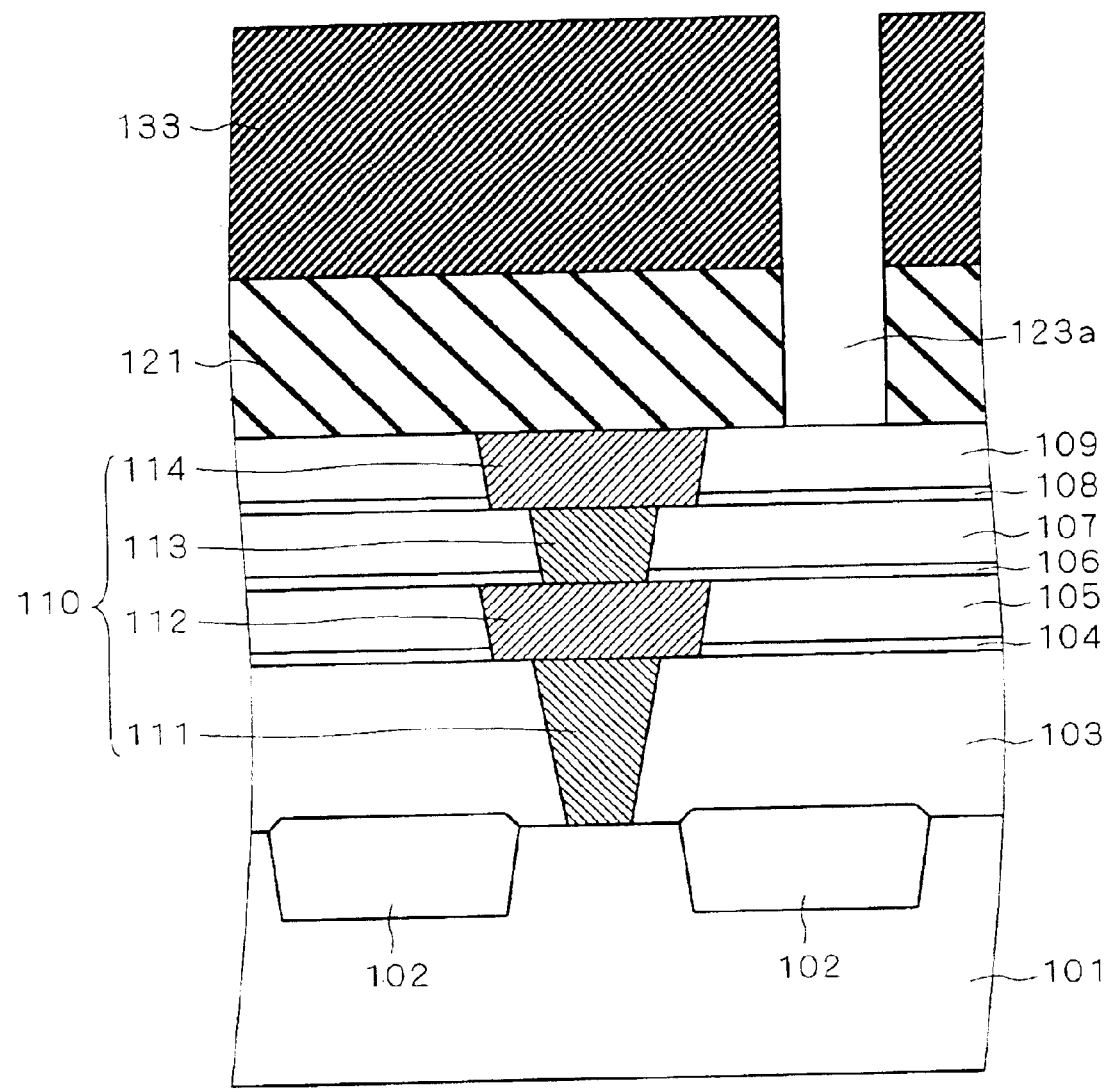

Next, the plasma nitride layer 121 of the passivation film 120 is deposited to a thickness of 800 nm (FIG. 6). Then, a resist mask 133 is formed on the plasma nitride layer 121, which is then etched using the resist mask 133 as a mask, to form the opening 123a. At that time, the opening 123a is formed so as to surround a periphery of the seal ring 110, and to have a shape of a slit with a width of 1 μm, for example (FIG. 7).

Lastly, the polyimide layer 122 is deposited and etched using a resist mask having an opening which is located above the opening 123a, as a mask, to form the opening 123b in the polyimide layer 122. By the foregoing processes, the semiconductor device according to the first preferred embodiment illustrated in FIG. 1 is completed.

It is noted that though each of the interlayer insulating films 103, 105, 107 and 109 is made of plasma nitride in the above description, each of the interlayer insulating films 103, 105, 107 and 109 may alternatively be a film of a low dielectric constant (low-k) material such as an FSG (F-doped Silicate Glass) film, an organic film or a film of SiON, SiOC or SiCF. Also, respective thicknesses of the interlayer insulating films are not limited to the thicknesses noted in the above description and may vary in a range between 0 and 200 nm, inclusive. Further, though each of the etch stop layers 104, 106 and 108 is made of plasma nitride in the above description, each of the etch stop layers 104, 106 and 108 may alternatively be made of SiC or SiON, for example. Also, respective thicknesses of the etch stop layers are not limited to the thicknesses noted in the above description. Further, the material for forming each of the first and second contacts 111 and 113 is not limited to tungsten and may alternatively be another kind of metal such as Al, TiN, Ru or Cu, or polysilicon.

Moreover, though the passivation film 120 has a bilayer structure of the plasma nitride layer 121 and the polyimide layer 122 in the above description, the passivation film 120 may alternatively have a single-layer structure or a multilayer structure having more than two layers. Also, the material for the passivation film 120 is not limited to plasma nitride and polyimide, and the passivation film 120 may alternatively be made of a film of a low dielectric constant material such as an FSG film, an organic film or a film of SiON, SiOC or SiCF, for example. Furthermore, the width of the opening 123 formed in the passivation film 120 is not limited to 1 μm.

The passivation film 120 may include another opening having a shape of a slit on the inner side of the seal ring 110 in addition to the opening 123 on the outer side of the seal ring 110, if such layout is possible. To include such additional opening would enhance the effect of preventing occurrence of a crack in the circuit region. However, as such additional opening may possibly increase a risk of reducing the effect of protecting the semiconductor device achieved by the passivation film 120, a care must be taken in that regard.

The opening 123 may not necessarily have a shape of a slit, and may alternatively have a structure which completely excludes the passivation film 120 from the dicing region side, for example.

Further, though the FIG. 1 illustrates that the opening 123a of the plasma nitride layer 121 and the opening 123b of the polyimide layer 122 which form the opening 123 have the substantially same width, the opening 123a of the plasma nitride layer 121 may be formed so as to have a width larger than that of the opening 123b if such layout is possible (alternatively, the opening 123b of the polyimide film 122 may be formed so as to have a width smaller than that of the opening 123a if an exposure on such size is possible). This increases a margin for misalignment between the openings 123a and 123b.

Moreover, a process sequence for forming the opening 123 is not limited to the above-described process sequence of: first forming the opening 123a of the plasma nitride layer 121; next depositing the polyimide layer 122; and then forming the opening 123b. The following process sequence may alternatively be used for forming the opening 123. Specifically, first, the plasma nitride layer 121 and the polyimide layer 122 are deposited, and the opening 123b is formed in the polyimide layer 122. Thereafter, the opening 123a is formed in the plasma nitride layer 121 in a self-aligned manner using the polyimide layer 122 as a mask. This alternative process sequence eliminates a need of aligning the openings 123a and 123b with each other, to reduce the number of manufacturing processes.

Additionally, the above description of the first preferred embodiment is directed to a semiconductor device having a bilayer interconnect structure. However, it is evident that the same advantages as described above can be produced in a case where a semiconductor device has a single-layer interconnect structure or a multilayer interconnect structure having three or more interconnect layers.

Second Preferred Embodiment

Figure 8:
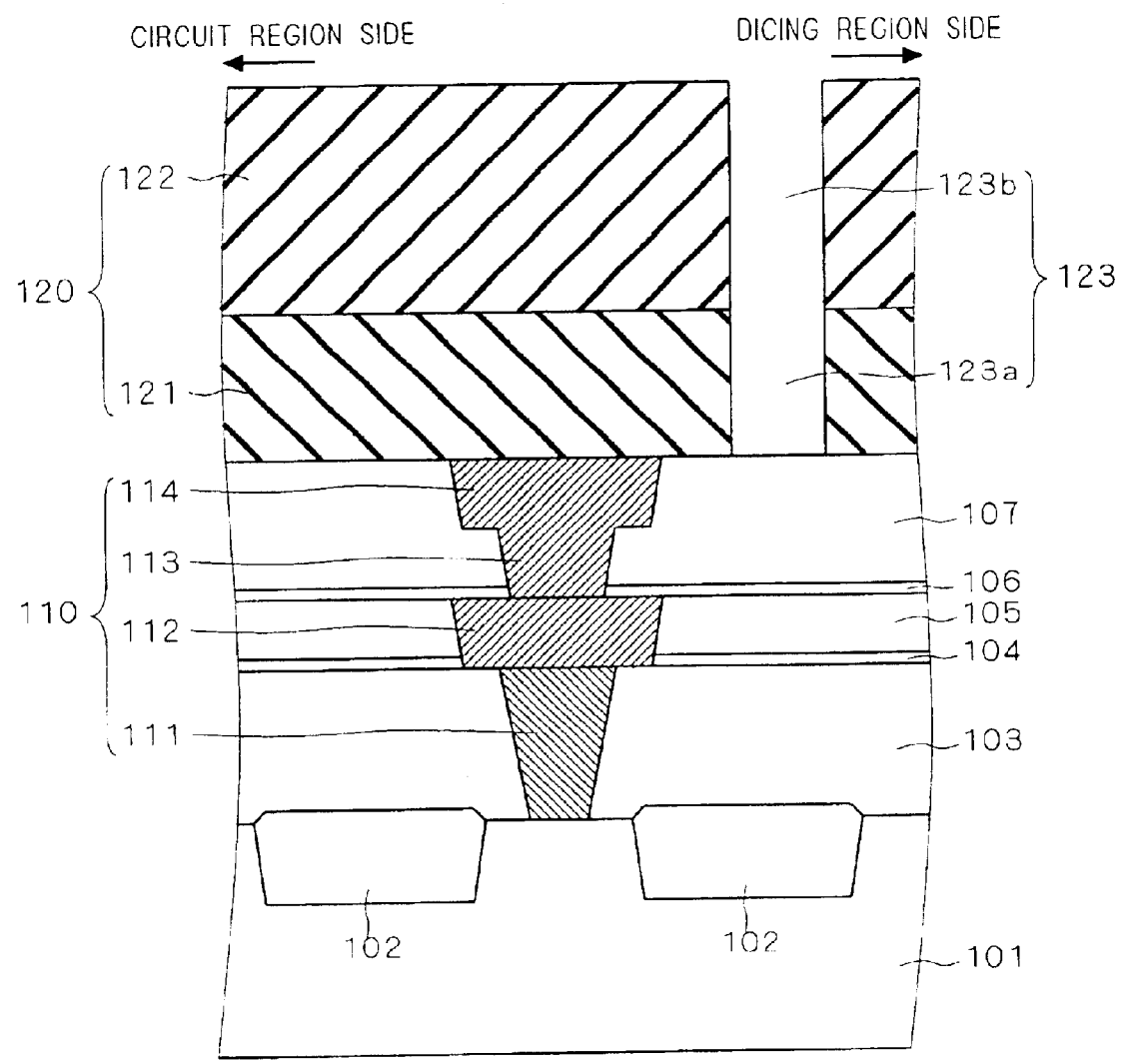
FIG. 8 is a view illustrating a structure of a semiconductor device according to a second preferred embodiment.

In the first preferred embodiment, each of the layers included in the seal ring 110 is formed by a single damascene process. However, a dual damascene process may be employed for forming any of the layers included in the seal ring 110, depending on a process sequence for forming a circuitry in the circuit region. FIG. 8 is a view illustrating an exemplary structure of a semiconductor device according to a second preferred embodiment in which the second contact 113 and the second interconnect layer 114 of the seal ring 110 are formed by a dual damascene process. In FIG. 8, the same elements as those in FIG. 1 are indicated by the same reference numerals. As a contact and an interconnect layer are simultaneously buried in accordance with a dual damascene process, both of the second contact 113 and the second interconnect layer 114 are made of copper.

According to the second preferred embodiment, as with the first preferred embodiment, the opening 123 having a shape of a slit and reaching the interlayer insulating film 109 is formed in the passivation film 120 so as to surround a periphery of the seal ring 110. Also, the top face of the second interconnect layer 114 is completely covered by the passivation film 120, so that the top face of the second interconnect layer 114 is not exposed to an ambient air.

Accordingly, the second preferred embodiment produces the same advantage as produced in the first preferred embodiment. More specifically, according to the second preferred embodiment, it is possible to prevent the effect of protecting the semiconductor device achieved by the seal ring 110 from being reduced due to oxidation and corrosion of the second interconnect layer 114. Further, provision of the opening 123 does not allow a stress generated at a time of cutting the dicing region during dicing to easily propagate to a portion of the passivation film 120 which is present on the circuit region. Hence, it is possible to prevent a crack from occurring in the circuit region.

Figure 9:
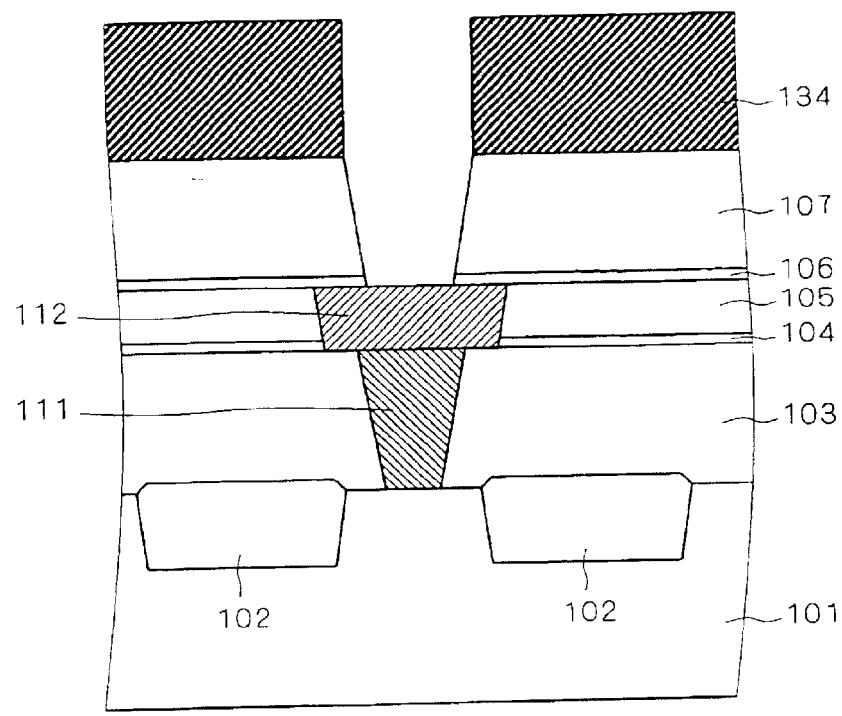
FIGS. 9 through 11 are views for illustrating processes of manufacturing the semiconductor device according to the second preferred embodiment.
Figure 10:
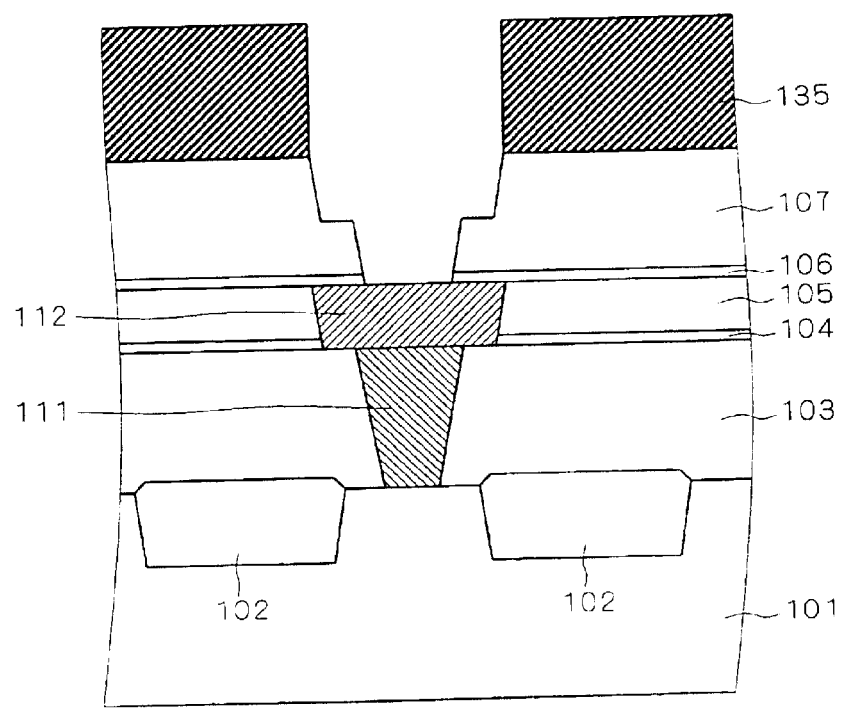
Figure 11:
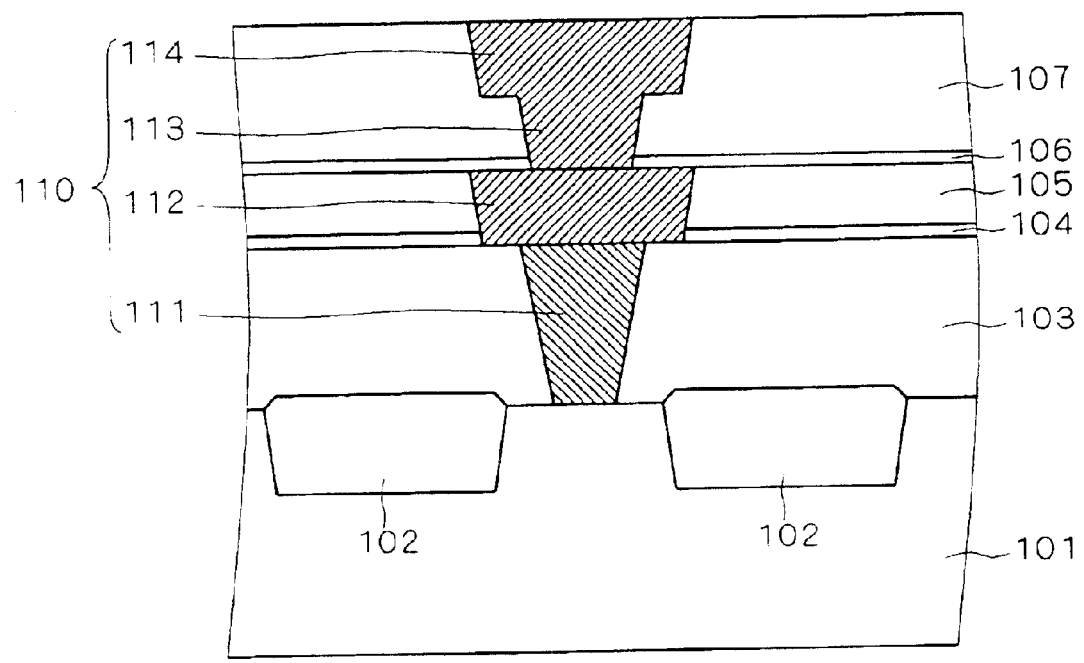

FIGS. 9 through 11 are views for illustrating processes of manufacturing the semiconductor device illustrated in FIG. 8. Below, the processes of manufacturing the semiconductor device according to the second preferred embodiment will be described with reference to those figures.

First, the interlayer insulating film 103, the etch stop layer 104, the interlayer insulating film 105, the first contact 111 and the first interconnect layer 112 are formed on the silicon substrate 101 in which the isolation film 102 is formed. Processes of forming the foregoing elements are the same as those in the first preferred embodiment, and detailed description therefor will be omitted in the second preferred embodiment.

Next, the etch stop layer 106 made of plasma nitride, for example, is formed, and subsequently the interlayer insulating film 107 made of plasma oxide, for example, is formed. Thereafter, a resist mask 134 having an opening which is located at a portion where the second contact 113 is to be formed is formed on the interlayer insulating film 107. Then, dry etching is performed using the resist mask 134 as a mask, to form an opening for forming the second contact 113 (FIG. 9).

The resist mask 134 is removed, and thereafter, a resist mask 135 having an opening which is located at a portion where the second interconnect layer 114 is to be formed is formed. Then, dry etching is performed on the interlayer insulating film 107 using the resist mask 135 as mask, thereby to form an opening for forming the second interconnect layer 114 in the interlayer insulating film 107 (FIG. 10).

The resist mask 135 is removed, and thereafter films of TaN and Ta each having a thickness of 10 nm is formed by a sputtering process, to form a barrier metal (not shown). Subsequently, copper is deposited by a plating process. Then, respective portions of the copper and the barrier metal which are present on the interlayer insulating film 107 are removed by a CMP process, to complete the second contact 113 and the second interconnect layer 114 in the interlayer insulating film 107 (FIG. 11).

After that, the passivation film 120 having the opening 123 is formed by the same processes as described in the first preferred embodiment, to complete the semiconductor device according to the second preferred embodiment as illustrated in FIG. 8.

As described above, a contact and an interconnect layer are simultaneously buried in a dual damascene process, which reduces the number of manufacturing processes. Further, as generally known, a dual damascene process allows reduction of a margin for misalignment as compared to a single damascene process, so that the seal ring 110 can be more surely formed.

Third Preferred Embodiment

Figure 12:
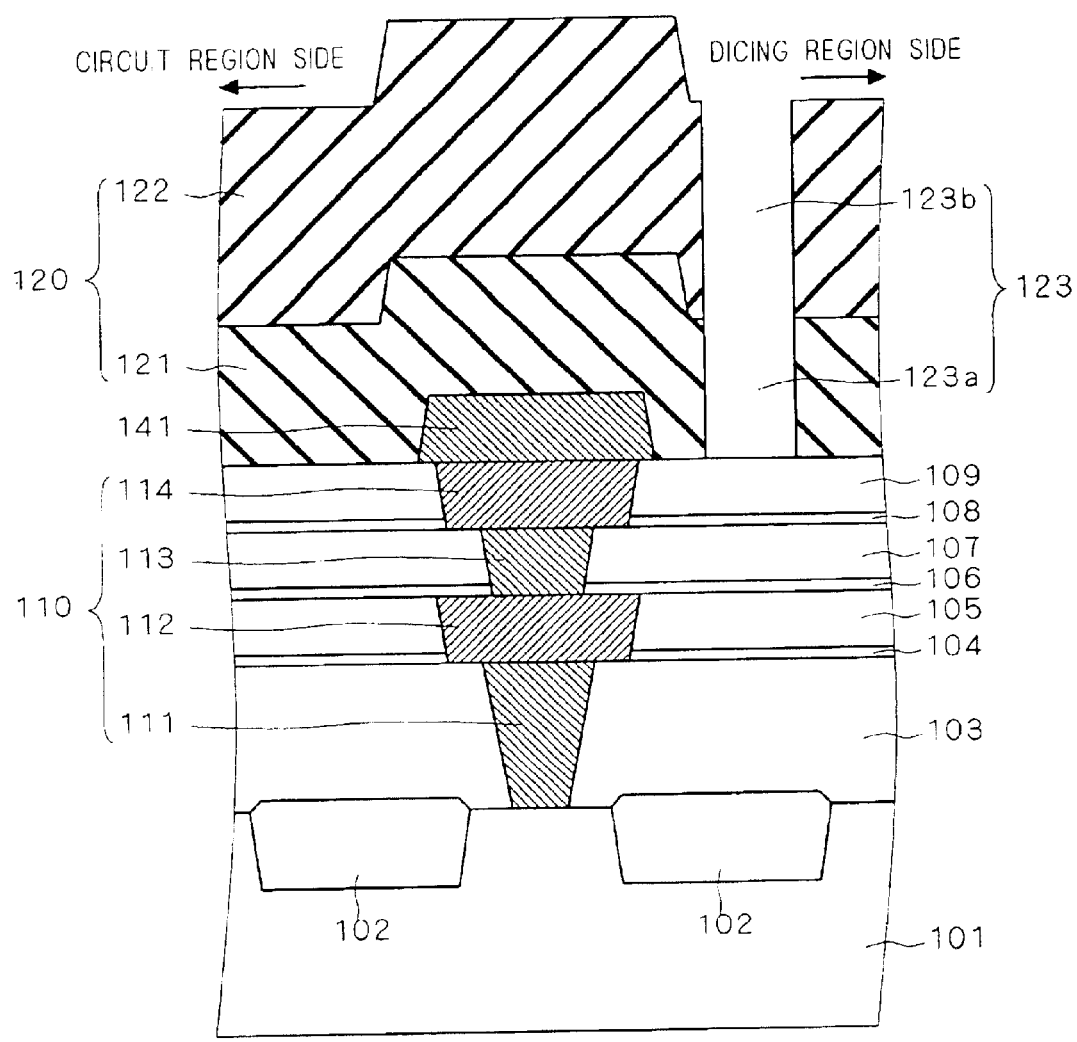
FIG. 12 is a view illustrating a structure of a semiconductor device according to a third preferred embodiment.

FIG. 12 is a view illustrating a structure of a semiconductor device according to a third preferred embodiment. In FIG. 12, the same elements as in FIG. 1 are indicated by the same reference numerals. According to the third preferred embodiment, an aluminum interconnect layer 141 is formed on the uppermost layer of the seal ring 110, i.e., the second interconnect layer 114, so that the top face of the second interconnect layer 114 is covered by the aluminum interconnect layer 141, as illustrated in FIG. 12.

It is noted that according to the third preferred embodiment, as with the first preferred embodiment, the opening 123 having a shape of a slit and reaching the interlayer insulating film 109 is formed in the passivation film 120 so as to surround a periphery of the seal ring 110. Also, the top face of the second interconnect layer 114 is completely covered by the aluminum interconnect layer 141, so that the top face of the second interconnect layer 114 is not exposed to an ambient air.

Accordingly, the third preferred embodiment produces the same advantage as produced in the first preferred embodiment. More specifically, it is possible to prevent the effect of protecting the semiconductor device achieved by the seal ring 110 from being reduced due to oxidation and corrosion of the second interconnect layer 114. Further, provision of the opening 123 does not allow a stress generated at a time of cutting the dicing region during dicing to easily propagate to a portion of the passivation film 120 which is present on the circuit region. Hence, it is possible to prevent a crack from occurring in the circuit region.

Now, consider a situation where the opening 123 happens to be formed above the second interconnect layer 114 due to misalignment in the structure according to the first preferred embodiment, for example. In such a situation, the second interconnect layer 114 is exposed in the opening 123 in the first preferred embodiment. In contrast, according to the third preferred embodiment, even if the opening 123 happens to be formed above the second interconnect layer 114, it merely results in that the aluminum interconnect layer 141 is exposed in the opening 123 and the second interconnect layer 114 formed thereunder is escaped from being exposed. As aluminum is more resistant to oxidation and corrosion than copper, the effect of protecting the semiconductor device achieved by the seal ring 110 is not be reduced. Thus, the third preferred embodiment is effective when a high alignment accuracy in forming the opening 123 can not be ensured.

Further, the third preferred embodiment provides for another situation where a space for the opening 123 can not be obtained between the dicing region and the seal ring 110. More specifically, when the opening 123 has to be formed above or on the inner side of the seal ring 110, the opening 123 may be deliberately formed above the aluminum interconnect layer 141. As long as the opening 123 is positioned on the aluminum interconnect layer 141, the second interconnect layer 114 and the interlayer insulating film 109 on the inner side of the seal ring 110 are escaped from being exposed in the opening 123. Hence, it is possible to prevent reduction of the effect of protecting the semiconductor device achieved by the seal ring 110 and the passivation film 120.

Figure 13:
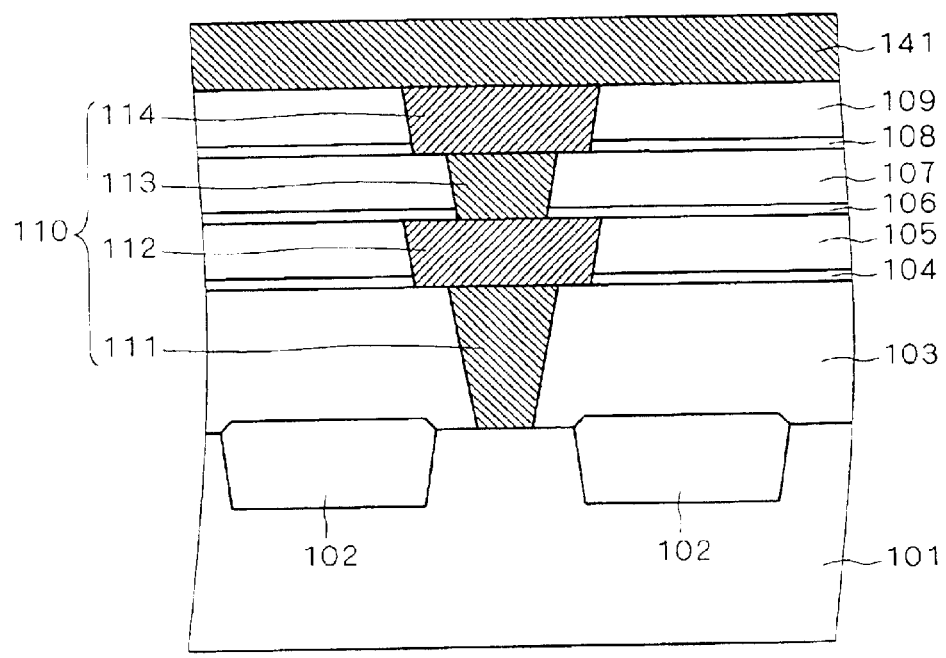
FIGS. 13 through 16 are views for illustrating processes of manufacturing the semiconductor device according to the third preferred embodiment.
Figure 14:
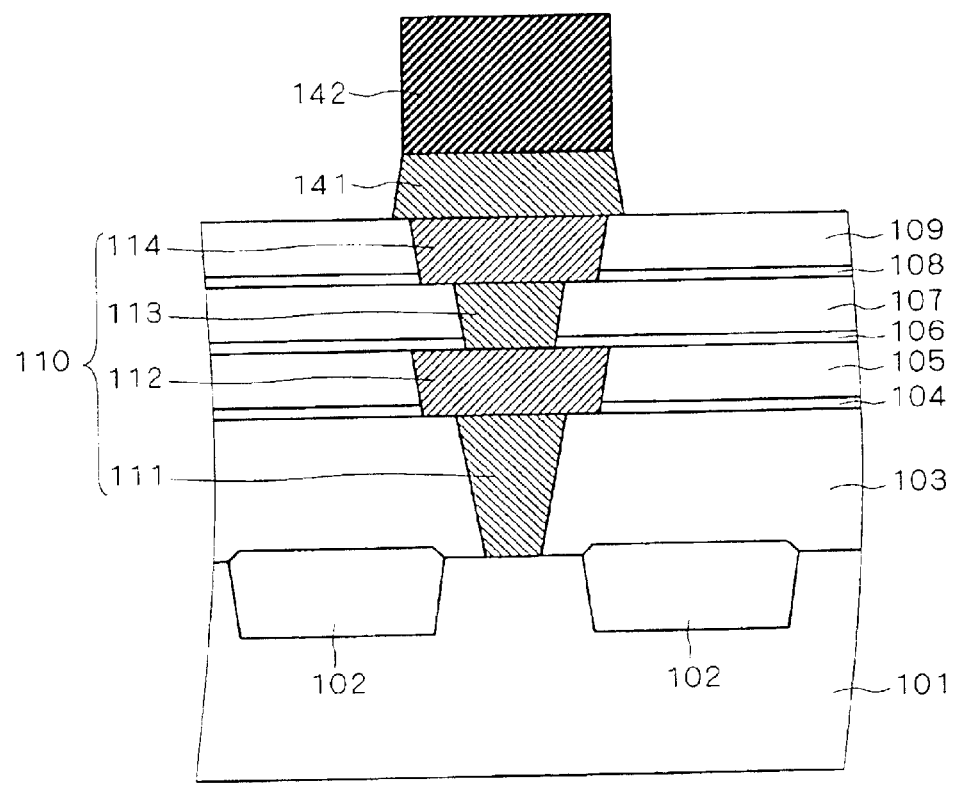
Figure 15:
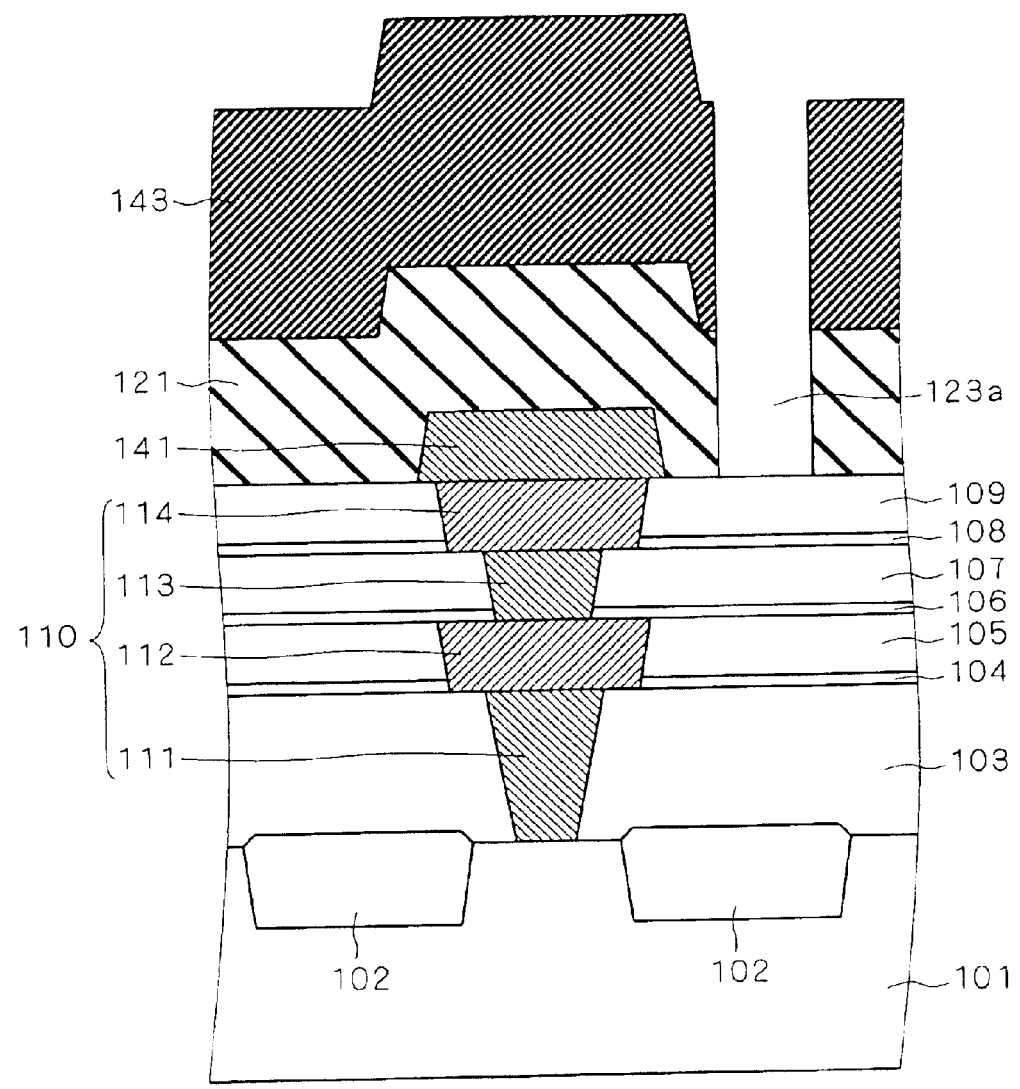

FIGS. 13 through 15 are views for illustrating the semiconductor device in FIG. 12. Below, processes of manufacturing the semiconductor device according to the third preferred embodiment will be described with reference to those figures.

First, the seal ring 110 is formed by the same processes as illustrated in FIGS. 2 through 5 in the first preferred embodiment. Details of the processes are the same as described in the first preferred embodiment, and thus will be omitted in the third preferred embodiment. After formation of the seal ring 110, the aluminum interconnect layer 141 is formed on the second interconnect layer 114 of the seal ring 110 and interlayer insulating film 109 (FIG. 13).

Next, a resist mask 142 is formed above the second interconnect layer 114, which is then etched using the resist mask 142 as a mask. As a result, the aluminum interconnect layer 141 covering substantially only the top face of the second interconnect layer 114 is formed (FIG. 14). The etching at that time is performed so as to make the aluminum interconnect layer 141 slightly larger in width than the second interconnect layer 114, to allow for misalignment between the second interconnect layer 114 and the aluminum interconnect layer 141. By controlling the width of the aluminum interconnect layer 141 so as to be larger than that of the second interconnect layer 114 by an amount of possible misalignment between the two layers or more, it is possible to ensure that the top face of the second interconnect layer 114 is completely covered by the aluminum interconnect layer 141.

Then, the resist mask 142 is removed, and the plasma nitride layer 121 of the passivation film 120 is deposited. Subsequently, a resist mask 143 is formed on the plasma nitride layer 121, which is then etched using the resist mask 143 as a mask, to form the opening 123a. At that time, the opening 123a is formed so as to surround the periphery of the seal ring 110 (FIG. 15).

Lastly, the polyimide layer 122 is deposited and etched using a resist mask having an opening which is located above the opening 123a, as a mask, to form the opening 123b in the polyimide layer 122. By the foregoing processes, the semiconductor device according to the third preferred embodiment illustrated in FIG. 12 is completed.

Figure 16:
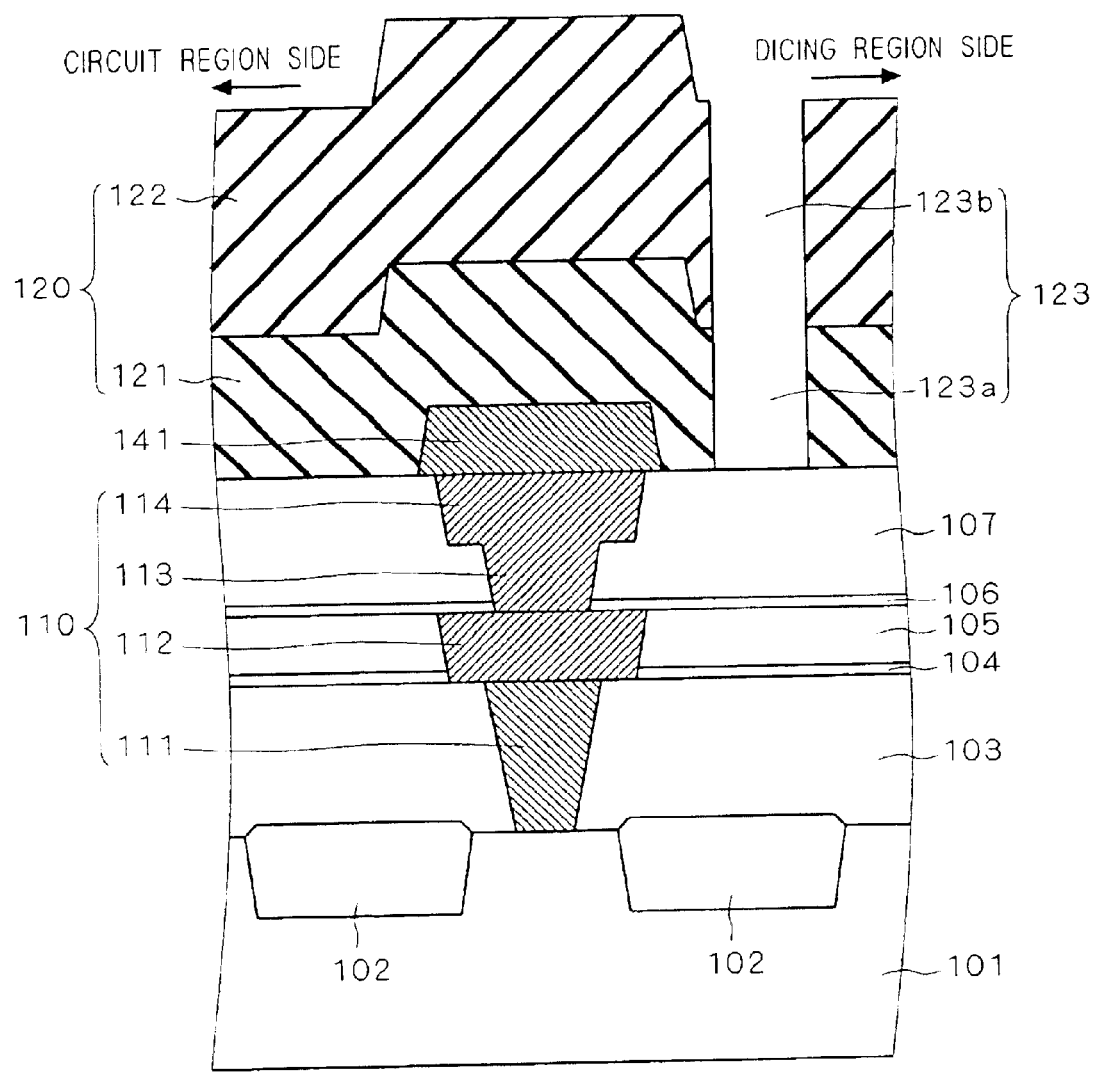

The above description of the third preferred embodiment has been made on the assumption that each of the layers included in the seal ring 110 is formed by a single damascene process. However, a dual damascene process may be employed for forming any of the layers included in the seal ring 110, depending on a process sequence for forming a circuitry in the circuit region. FIG. 16 is a view illustrating an exemplary structure in which the second contact 113 and the second interconnect layer 114 of the seal ring 110 are formed by a dual damascene process. As a contact and an interconnect layer are simultaneously buried in accordance with a dual damascene process, both of the second contact 113 and the second interconnect layer 114 are made of copper. Processes of forming the seal ring 110 illustrated in FIG. 16 are the same as described in the second preferred embodiment, and thus detailed description therefor will be omitted.

In a dual damascene process, a contact and an interconnect layer are simultaneously buried, which reduces the number of manufacturing processes. Further, as generally known, a dual damascene process allows reduction of a margin for misalignment as compared to a single damascene process, so that the seal ring 110 can be more surely formed.

Fourth Preferred Embodiment

In the above illustrative situation where the opening 123 happens to be formed above the second interconnect layer 114 due to misalignment, the second interconnect layer 114 is exposed in the opening in the structure according to the first preferred embodiment. The third preferred embodiment avoids the situation by including the aluminum interconnect layer 141 covering the second interconnect layer 114. According to the third preferred embodiment, however, it is required that the aluminum interconnect layer 141 should be formed so as to be slightly larger in width than the second interconnect layer 114 as described above. This may be a detrimental to miniaturization of a semiconductor device.

In view of the foregoing, one alternative for preventing the second interconnect layer 114 from being exposed in the opening 123 is to form a protective film having an etch selectivity relative to the plasma nitride layer 121 on the second interconnect layer 114 and the interlayer insulating film 109. However, this alternative is likely to cause a crack possibly occurring in the dicing region during dicing to propagate to the circuit region through the protective film.

Figure 17:
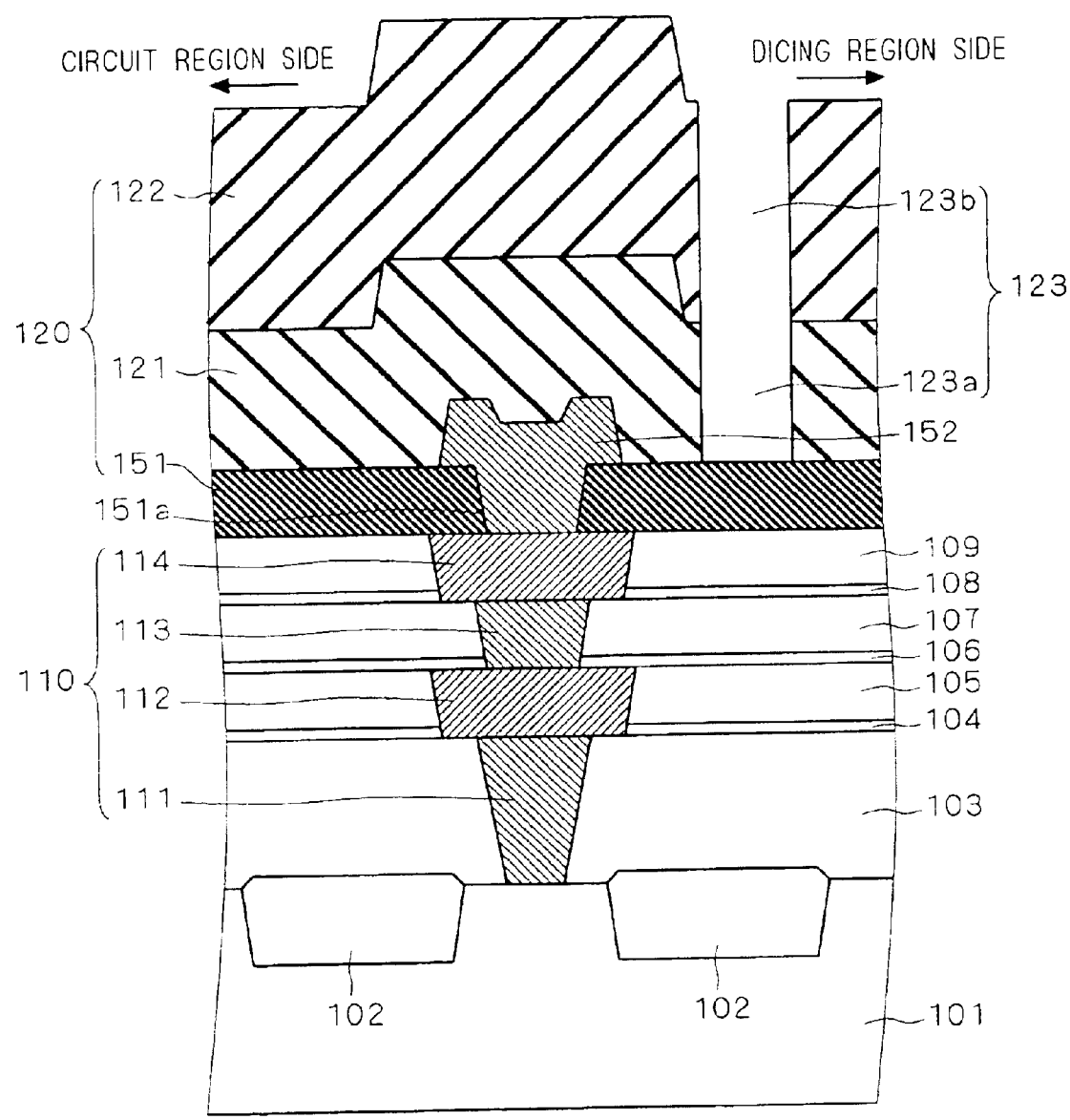
FIG. 17 is a view illustrating a structure of a semiconductor device according to a fourth preferred embodiment.

FIG. 17 is a view illustrating a semiconductor device according to a fourth preferred embodiment. In FIG. 17, the same elements as those in FIG. 1 are indicated by the same reference numerals. According to the fourth preferred embodiment, the passivation film 120 above the seal ring 110 has a trilayer structure of the polyimide layer 122, the plasma nitride layer 121 and a layer of plasma oxide (plasma oxide layer) 151. The plasma oxide layer 151 has an etch selectivity relative to the plasma nitride layer 121. Also, the plasma nitride layer 151 has an opening 151a which is located on the second interconnect layer 114, and an aluminum interconnect layer 152 is formed in the opening 151a.

According to the fourth preferred embodiment, even if the opening 123 is formed above the second interconnect layer 114, the second interconnect layer 114 is prevented from being exposed because the second interconnect layer 114 is covered by the aluminum interconnect layer 152 or the plasma oxide layer 151 having an etch selectivity relative to the plasma nitride layer 121. Thus, the fourth preferred embodiment is effective when a high alignment accuracy in forming the opening 123 can not be ensured.

Also, unlike the third preferred embodiment, it is not required that the aluminum interconnect layer 152 be larger in width than the second interconnect layer 114, and thus, the fourth preferred embodiment can contribute to miniaturization of a device. Further, because of inclusion of the opening 151a having the aluminum interconnect layer 152 formed therein in the plasma oxide layer 151, it is possible to prevent a crack possibly occurring in the dicing region during dicing from propagating to the circuit region through the plasma oxide layer 151.

Moreover, even when the opening 123 is formed above or on the inner side of the seal ring 110, the second interconnect layer 114 and the interlayer insulating film 109 on the inner side of the seal ring 110 are not exposed in the opening 123. Hence, the effect of protecting the semiconductor device achieved by the seal ring 110 and the passivation film 120 is not reduced.

The fourth preferred embodiment has been and will be described on the assumption that the layers indicated by the reference numerals 151 and 121 in FIG. 17 which function as first and second passivation films, respectively, are made of plasma oxide and plasma nitride, respectively. However, any other combination of materials for the first and second passivation films is applicable as long as there is an etch selectivity between the first and second passivation films.

Figure 18:
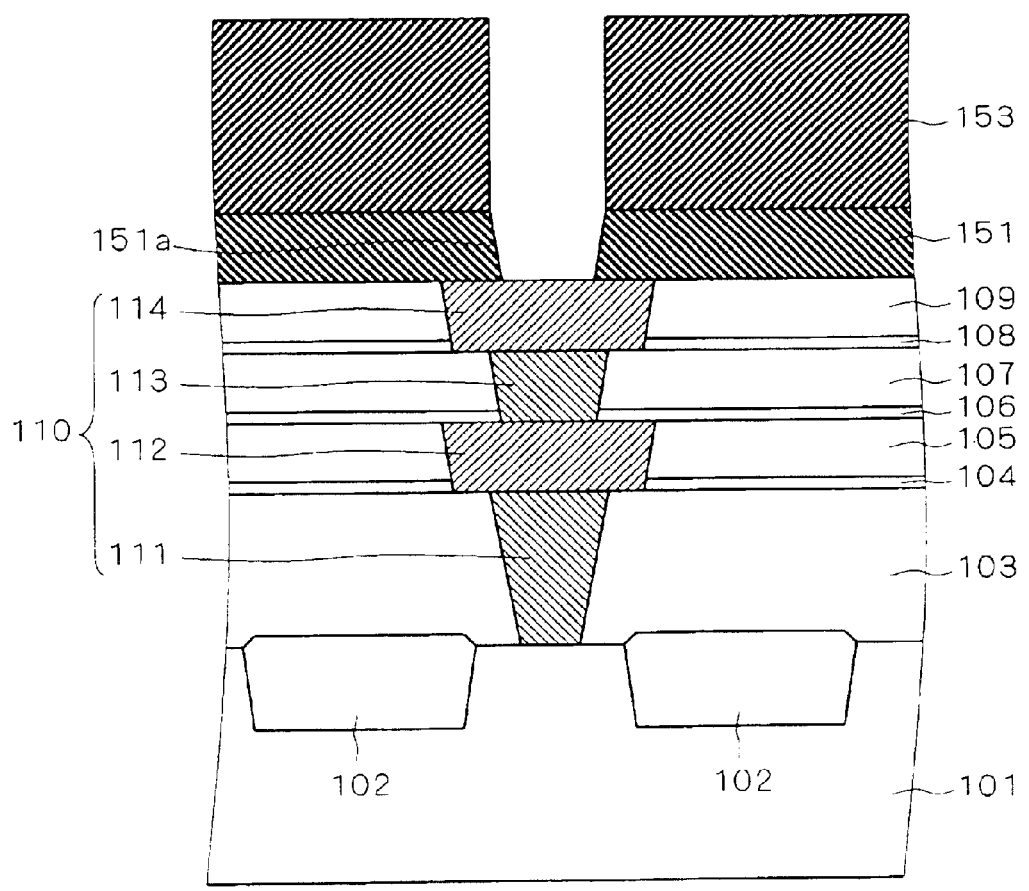
FIGS. 18 through 21 are views for illustrating processes of manufacturing the semiconductor device according to the fourth preferred embodiment.
Figure 19:
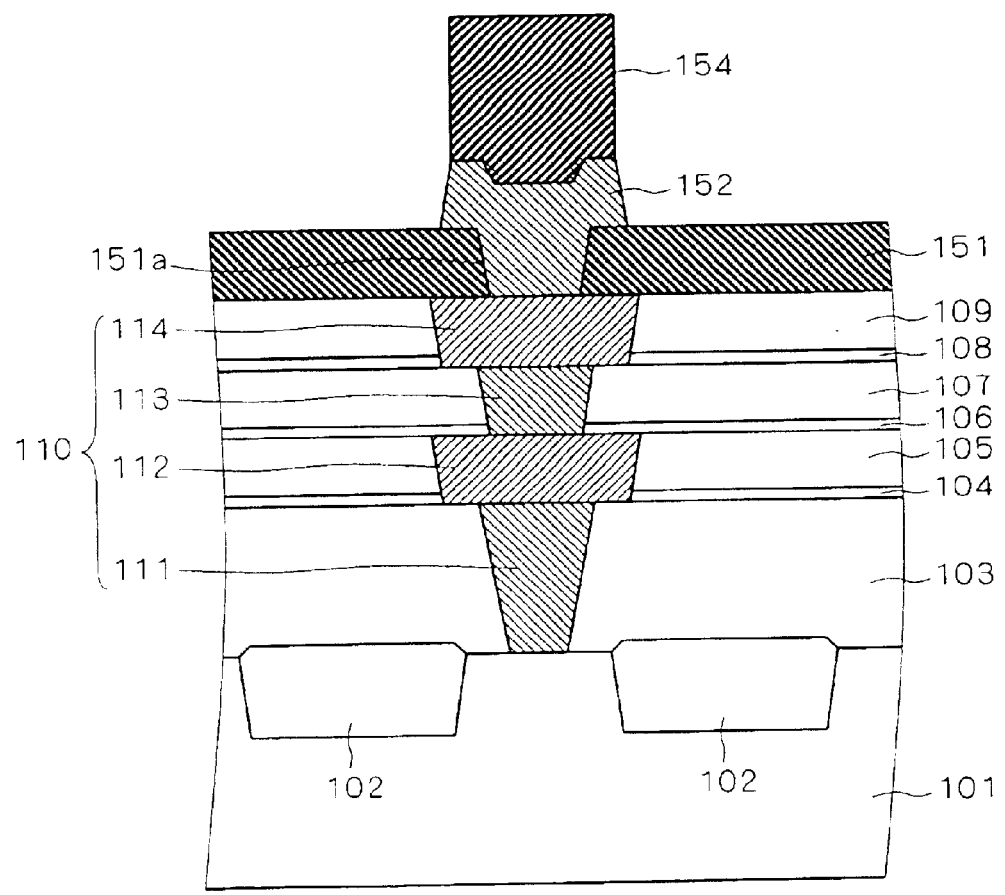
Figure 20:
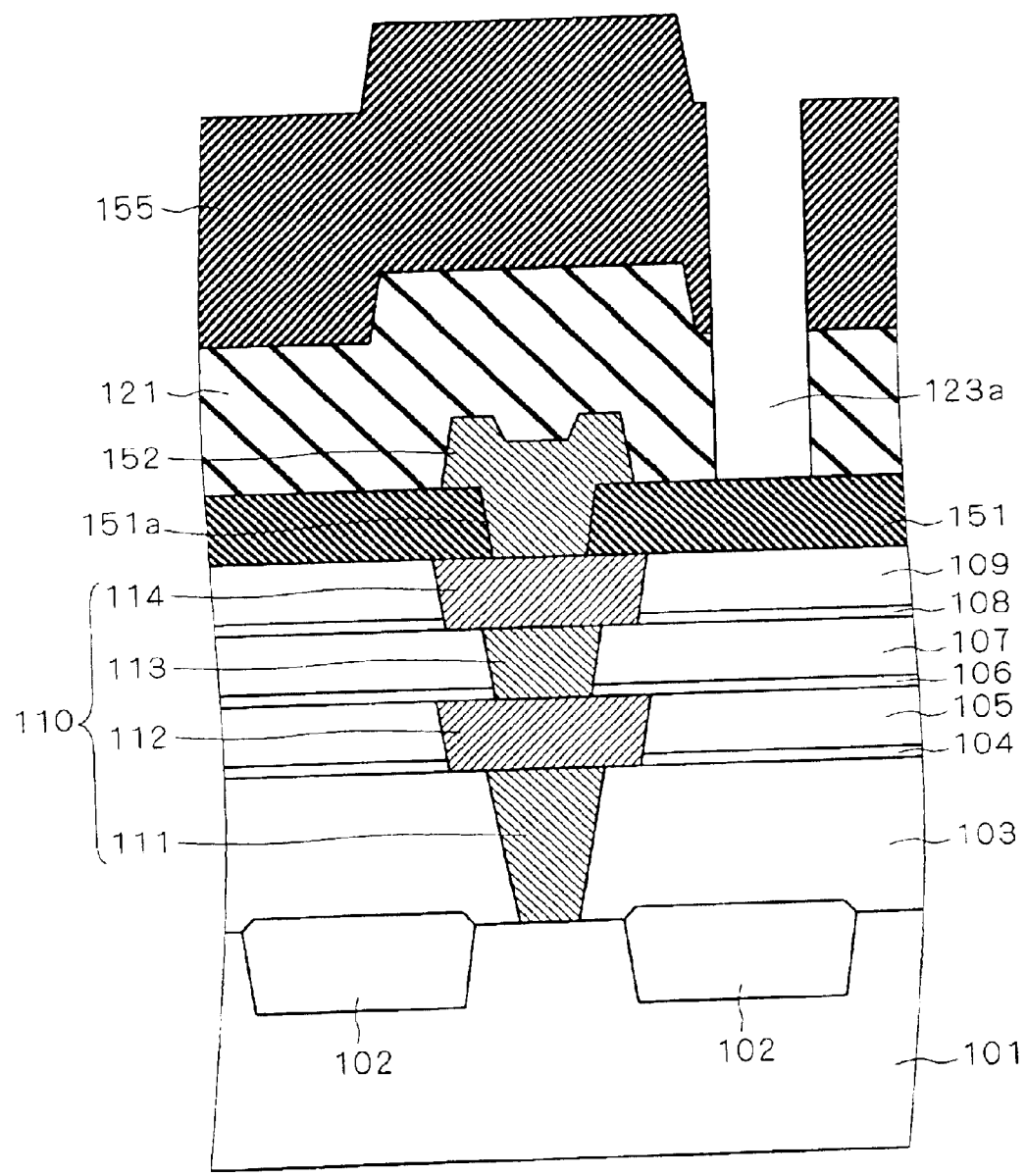

FIGS. 18 through 20 are views for illustrating processes of manufacturing the semiconductor device illustrated in FIG. 17. Below, the processes of manufacturing the semiconductor device will be described with reference to those figures.

First, the seal ring 110 is formed by the same processes as illustrated in FIGS. 2 through 5 in the first preferred embodiment. Details of the processes are the same as described in the first preferred embodiment, and thus will be omitted in the fourth preferred embodiment.

After formation of the seal ring 110, the plasma oxide layer 151 is formed on the second interconnect layer 114 of the seal ring 110 and the interlayer insulating film 109. Next, a resist mask 153 having an opening which is located above the second interconnect layer 114 is formed. Subsequently, the plasma oxide layer 151 is etched using the resist mask 153 as a mask, to form the opening 151a (FIG. 18). At that time, the width of the opening 151a can be arbitrarily chosen, and needs not be larger than the width of the second interconnect layer 114.

Next, the aluminum interconnect layer 152 is deposited on the plasma oxide layer 151. Then, a resist mask 154 is formed above the opening 151a, and the aluminum interconnect layer 152 is etched using the resist mask 154 as a mask (FIG. 19). For the etching at that time, while the resist mask 154 should be formed so as to be slightly larger in width than the opening 151a, the resist mask 154 does not necessarily have to have a width larger than that of the second interconnect layer 114. The width of the aluminum interconnect layer 152 is governed by the width of the resist mask 154. Accordingly, by setting the resist mask 154 so as to have a width smaller than that of the second interconnect layer 114, it is possible to provide a layout in which a width of the area where the seal ring 110 is formed is smaller than that in the third preferred embodiment, thereby to contribute to miniaturization of a device.

The resist mask 154 is removed, and the plasma nitride layer 121 of the passivation film 120 is deposited. Subsequently, a resist mask 155 is formed on the plasma nitride layer 121, which is then etched using the resist mask 155 as a mask, to form the opening 123a. At that time, the opening 123a is formed so as to surround the periphery of the seal ring 110 (FIG. 20).

Lastly, the polyimide layer 122 is deposited and etched using a resist mask having an opening which is located above the opening 123a, as a mask, to form the opening 123b in the polyimide layer 122. By the foregoing processes, the semiconductor device according to the fourth preferred embodiment illustrated in FIG. 17 is completed.

Figure 21:
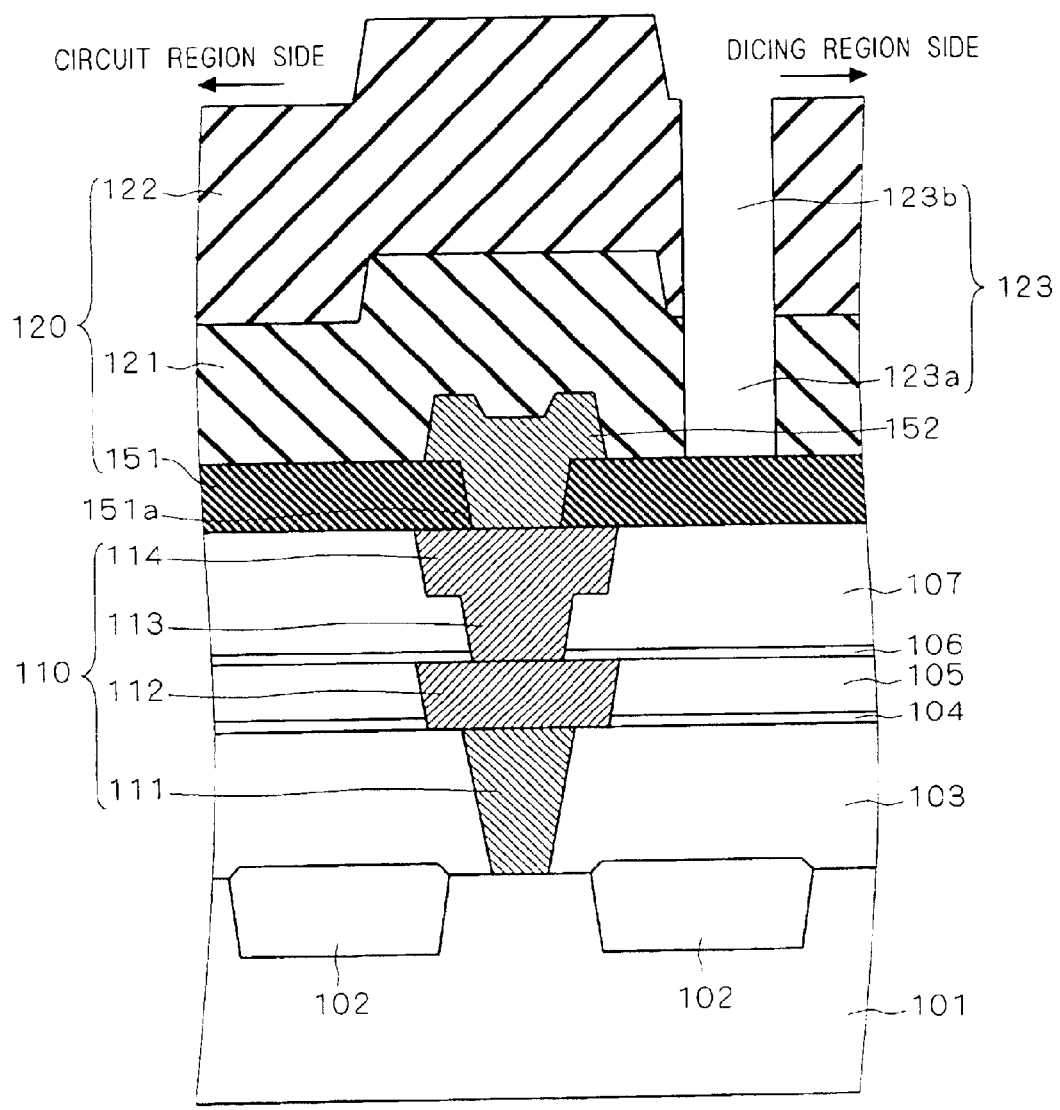

The above description of the fourth preferred embodiment has been made on the assumption that each of the layers included in the seal ring 110 is formed by a single damascene process. However, a dual damascene process may be employed for forming any of the layers included in the seal ring 110, depending on a process sequence for forming a circuitry in the circuit region. FIG. 21 is a view illustrating an exemplary structure in which the second contact 113 and the second interconnect layer 114 of the seal ring 110 are formed by a dual damascene process. As a contact and an interconnect layer are simultaneously buried in accordance with a dual damascene process, both of the second contact 113 and the second interconnect layer 114 are made of copper. Processes of forming the seal ring 110 illustrated in FIG. 21 are the same as described in the second preferred embodiment, and thus detailed description therefor will be omitted.

In a dual damascene process, a contact and an interconnect layer are simultaneously buried, which reduces the number of manufacturing processes. Further, as generally known, a dual damascene process allows reduction of a margin for misalignment as compared to a single damascene process, so that the seal ring 110 can be more surely formed.

Fifth Preferred Embodiment

Figure 22:
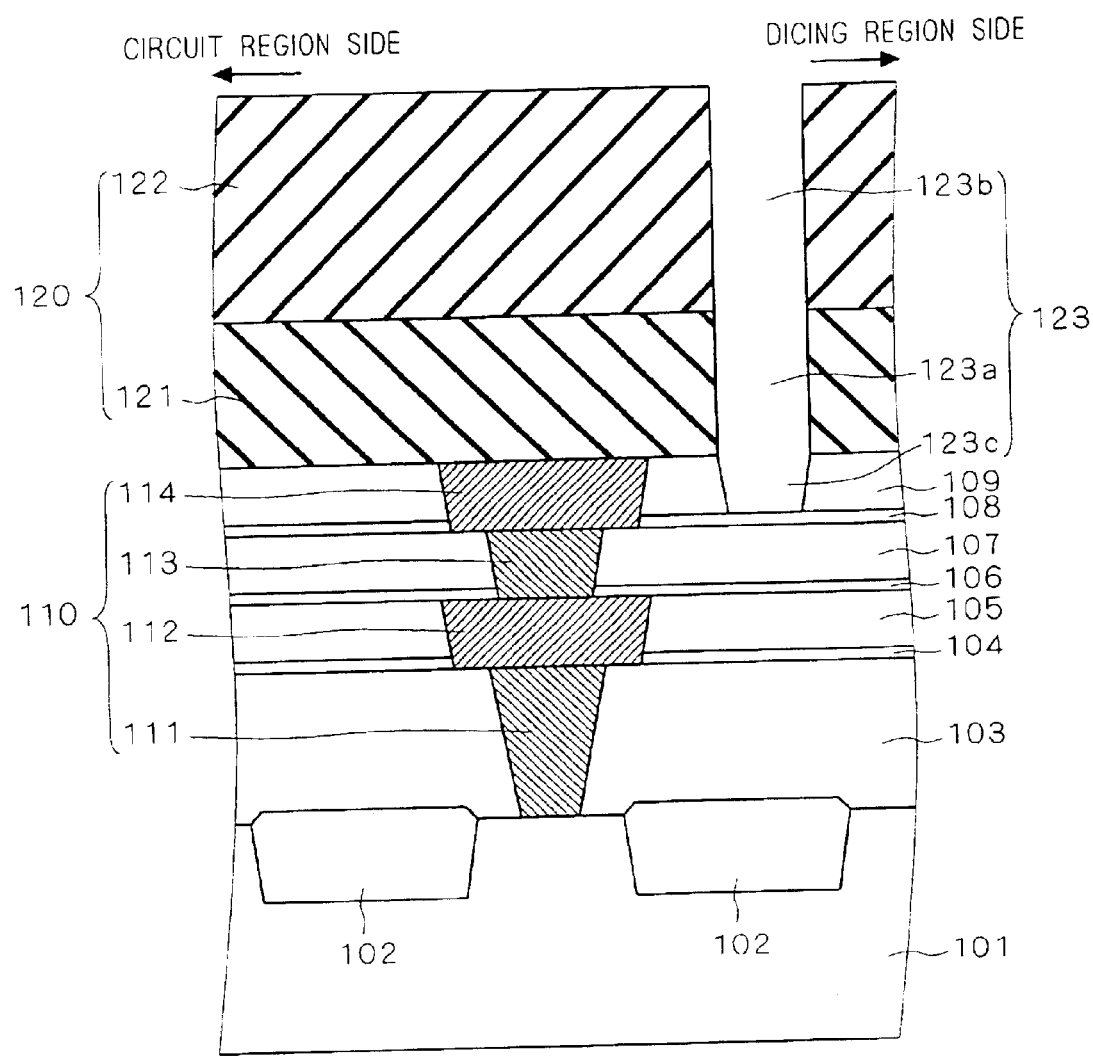
FIG. 22 is a view illustrating a structure of a semiconductor device according to a fifth preferred embodiment.

FIG. 22 is a view illustrating a semiconductor device according to a fifth preferred embodiment. In FIG. 22, the same elements as those in FIG. 1 are indicated by the same reference numerals. According to the fifth preferred embodiment, the opening 123 extends to reach the etch stop layer 108, as illustrated in FIG. 22. In other words, the opening 123 is composed of the opening 123b of the polyimide layer 122, the opening 123a of the plasma nitride layer 121 and an opening 123c of the interlayer insulating film 109. This structure more effectively prevents a stress generated at a time of cutting the dicing region during dicing from propagating to the circuit region, as compared to the structure in FIG. 1. Accordingly, in the fifth preferred embodiment, the effect of preventing occurrence of a crack in the circuit region is enhanced as compared to the first preferred embodiment.

Also, the fifth preferred embodiment is particularly effective in a structure where a low dielectric constant film (low-k film), examples of which has been cited above, is employed as a material for the interlayer insulating films. As generally known, a low-k film is mostly porous, and thus shrinks to a great extent when subjected to a heating process or the like. Accordingly, if a low-k film is employed as a material for the interlayer insulating film 109, for example, the interlayer insulating film 109 suffers a stress a due to shrinking properties of the material thereof (low-k film), so that a crack is more likely to occur in the interlayer insulating film 109. However, by including the opening 123c in the interlayer insulating film 109, it is possible to alleviate a stress caused due to shrinkage, thereby to prevent occurrence of a crack in the interlayer insulating film 109.

Figure 23:
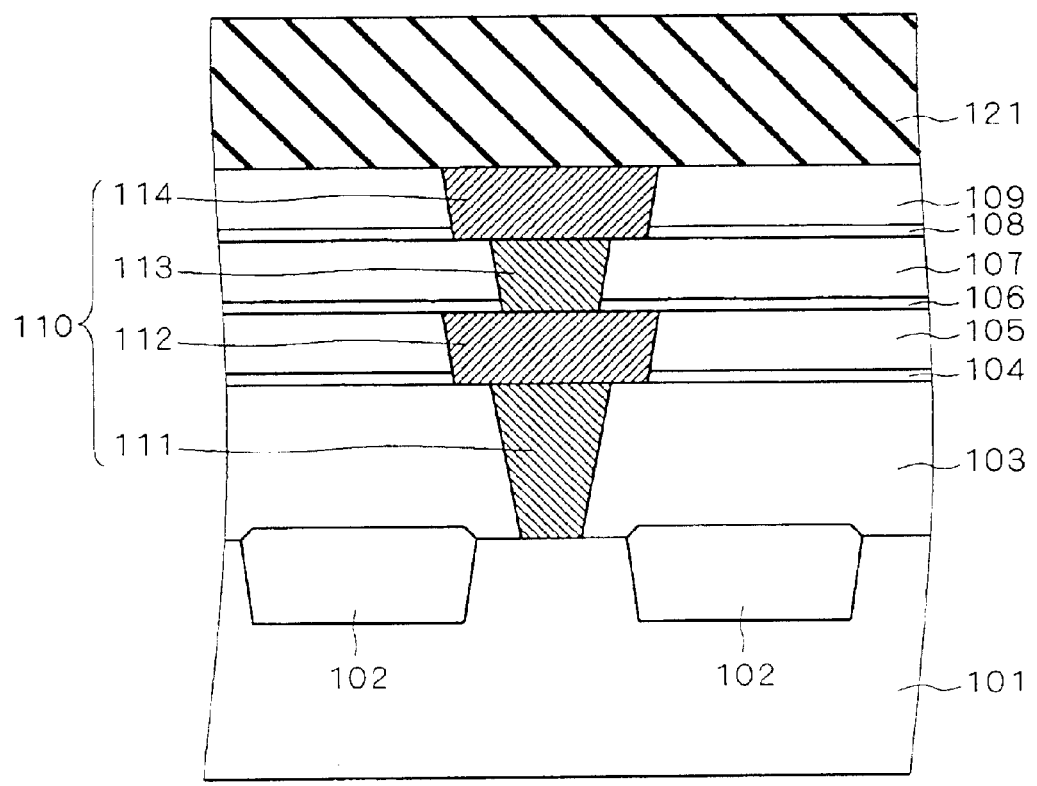
FIGS. 23 and 24 are views for illustrating processes of manufacturing the semiconductor device according to the fifth preferred embodiment.
Figure 24:
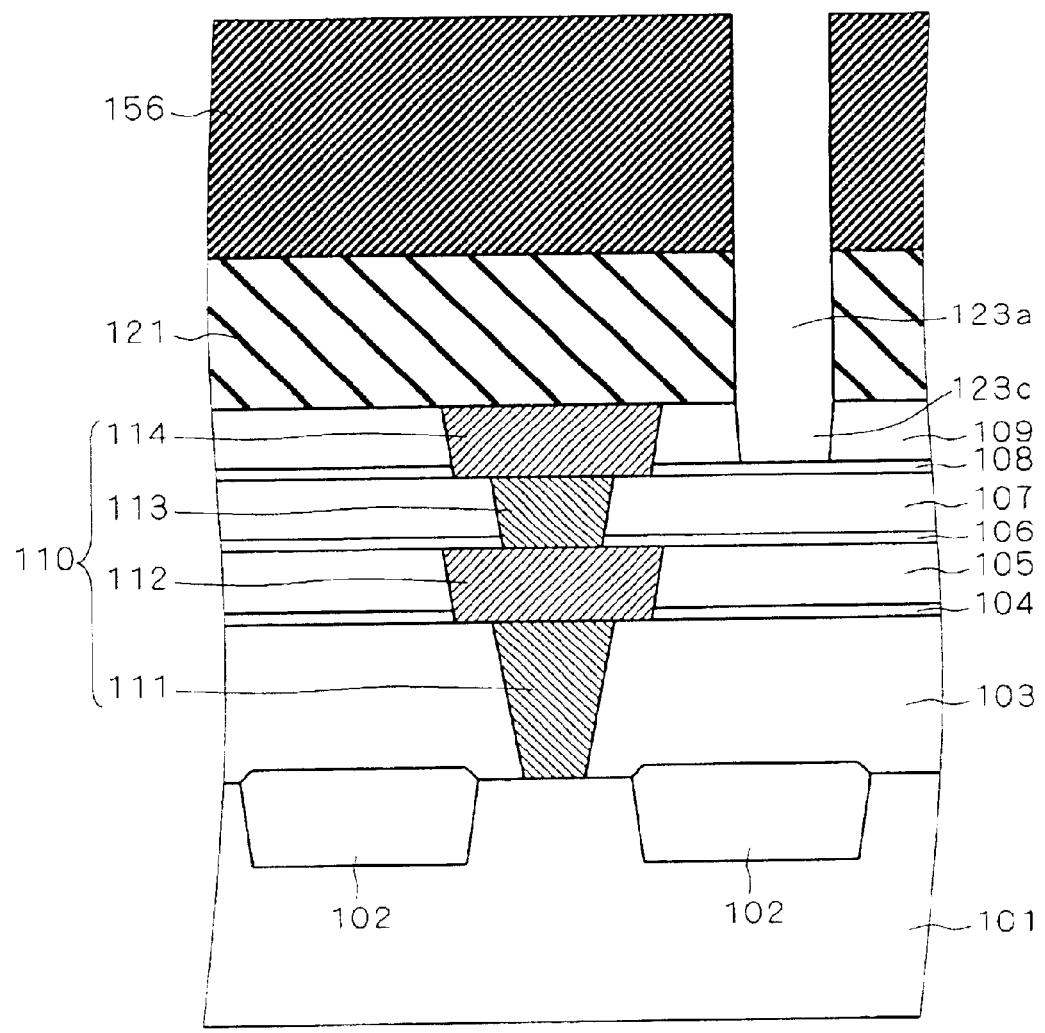

FIGS. 23 and 24 are views for illustrating processes of manufacturing the semiconductor device illustrated in FIG. 22. Below, the processes of manufacturing the semiconductor device will be described with reference to those figures.

First, the seal ring 110 is formed by the same processes as illustrated in FIGS. 2 through 6 in the first preferred embodiment, and the plasma nitride layer 121 of the passivation film 120 is deposited on the formed seal ring 110 (FIG. 23). Details of the processes are the same as described in the first preferred embodiment, and thus will be omitted in the fifth preferred embodiment.

Next, a resist mask 156 is formed on the plasma nitride layer 121, which is then etched using the resist mask 156 as a mask, to form the opening 123a surrounding the periphery of the seal ring 110, as well as to etch the interlayer insulating film 109 to form the opening 123c (FIG. 24).

Lastly, the polyimide layer 122 is deposited and etched using a resist mask having an opening which is located above the opening 123a, as a mask, to form the opening 123b in the polyimide layer 122. By the foregoing processes, the semiconductor device according to the fifth preferred embodiment illustrated in FIG. 22 is completed.

The above description of the fifth preferred embodiment has been made on the assumption that each of the layers included in the seal ring 110 is formed by a single damascene process. However, a dual damascene process may be employed as in the second preferred embodiment. To employ a dual damascene process results in a structure where the opening 123 extends to reach the etching stop layer 106 under the interlayer insulating film 107 in FIG. 8.

In a dual damascene process, a contact and an interconnect layer are simultaneously buried, which reduces the number of manufacturing processes. Further, as generally known, a dual damascene process allows reduction of a margin for misalignment as compared to a single damascene process, so that the seal ring 110 can be more surely formed.

Sixth Preferred Embodiment

When a dual damascene process is employed for forming a circuitry in the circuit region, also the seal ring 110 may be formed by a dual damascene process as described in the second preferred embodiment. However, each of the layers included in the seal ring 110 can alternatively be formed by only one step of forming a contact (contact forming step) in a flow of an entire dual damascene process.

Figure 25:
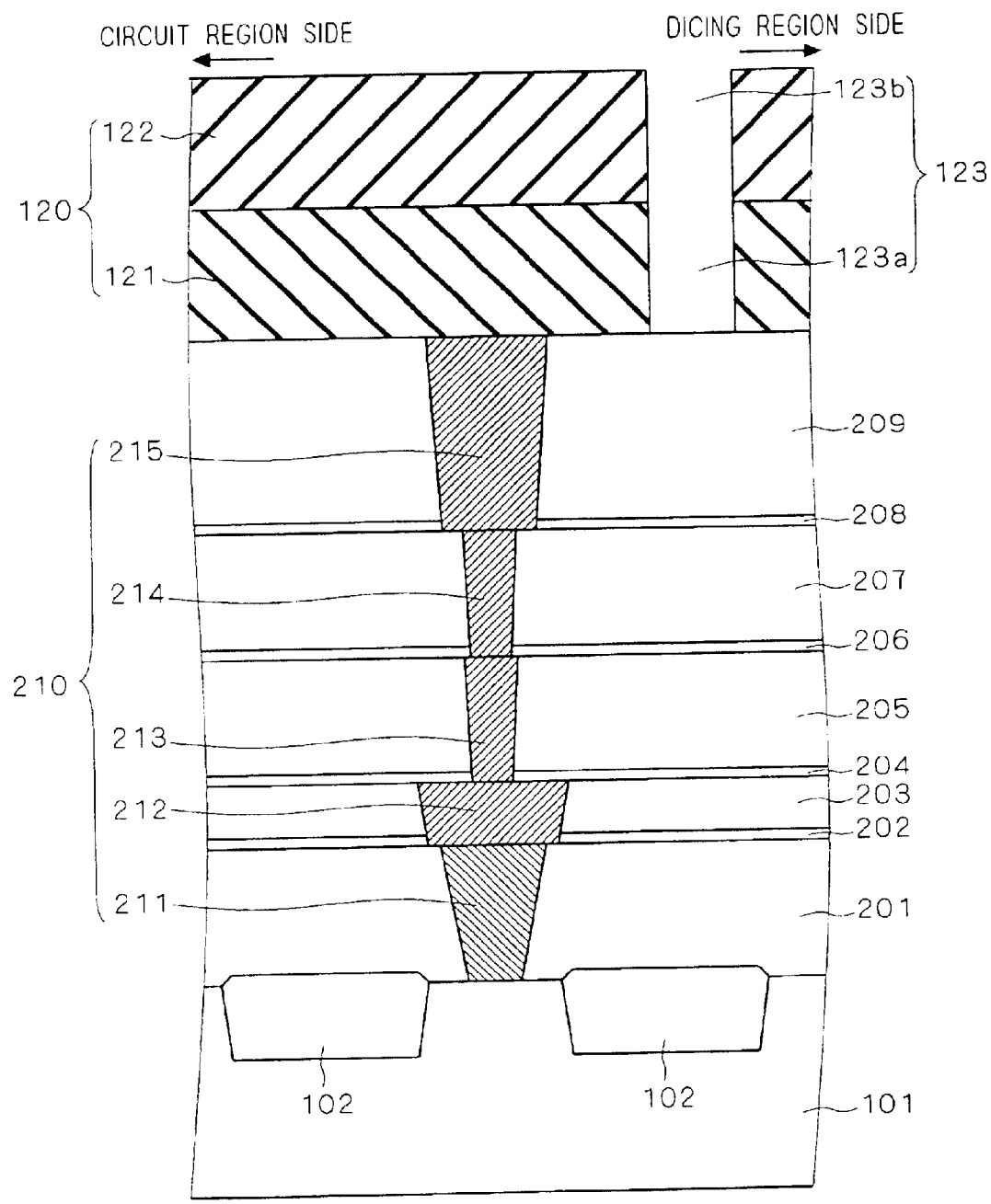
FIG. 25 is a view illustrating a structure of a semiconductor device according to a sixth preferred embodiment.

FIG. 25 is a view illustrating a structure of a semiconductor device according to a sixth preferred embodiment. In FIG. 25, the same elements as those in FIG. 1 are indicated by the same reference numerals. In the sixth preferred embodiment, it is assumed that copper is employed as a material for interconnects in the semiconductor device.

Referring to FIG. 25, a seal ring 210 includes a first contact 211, a first interconnect layer 212, a second contact 213, a third contact 214 and a fourth contact 215. The first contact 211 and the first interconnect layer 212 are formed by a single damascene process, and the second, third and fourth contacts 213, 214 and 215 are formed by a contact forming step in a flow of an entire damascene process. As a contact is made of the same material as used for forming an interconnect layer in accordance with a dual damascene process, each of the second, third and fourth contacts 213, 214 and 215 is made of copper.

On the silicon substrate 101 having the isolation film 102 formed therein, an interlayer insulating film 201 having the first contact 211 formed therein, an interlayer insulating film 203 having the first interconnect layer 212 formed therein, an interlayer insulating film 205 having the second contact 213 formed therein, an interlayer insulating film 207 having the third contact 214 formed therein and an interlayer insulating film 209 having the fourth contact 215 formed therein are formed. Further, etch stop layers 202, 204, 206 and 208 are formed between the interlayer insulating films 201 and 203, the interlayer insulating films 203 and 205, the interlayer insulating films 205 and 207, and the interlayer insulating films 207 and 209, respectively.

The passivation film 120 has the opening 123 formed therein. The opening 123 is composed of the opening 123a of the plasma nitride layer 121 and the opening 123b of the polyimide layer 122, and reaches the interlayer insulating film 209. The passivation film 120 is completely absent in the opening 123. Hence, it is possible to prevent a crack from occurring in the circuit region in the same manner as in the first preferred embodiment. Further, since the top face of the second interconnect layer 114 is completely covered by the passivation film 120, it is possible to prevent the effect of protecting the semiconductor device achieved by the seal ring 210 from being reduced due to oxidation and corrosion of the fourth contact 215.

Figure 26:
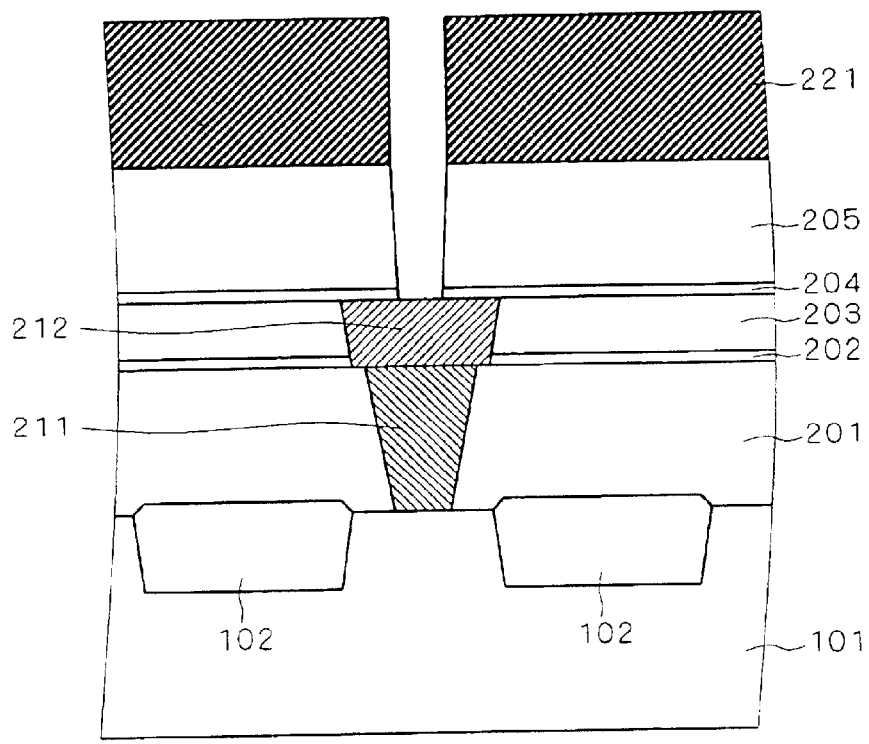
FIGS. 26 through 28 are views for illustrating processes of manufacturing the semiconductor device according to the sixth preferred embodiment.
Figure 27:
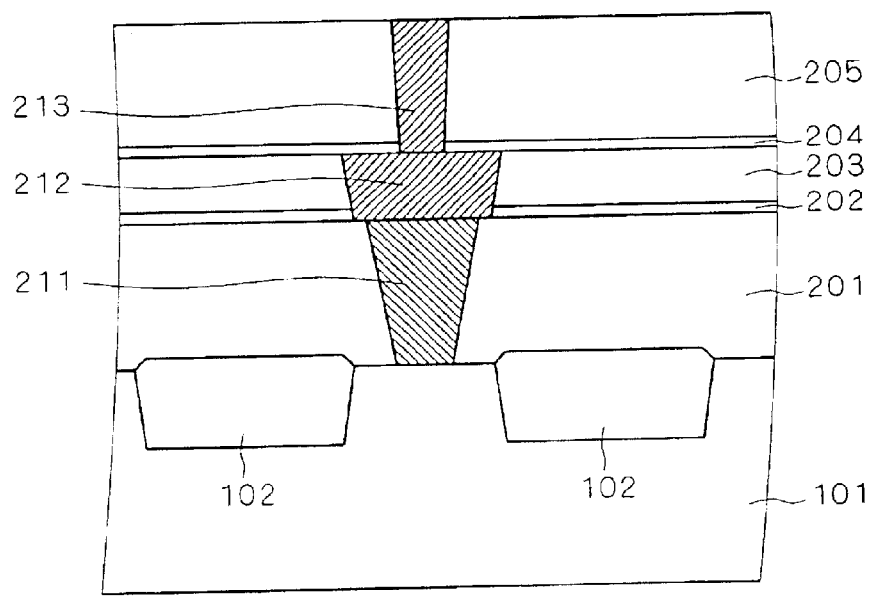
Figure 28:
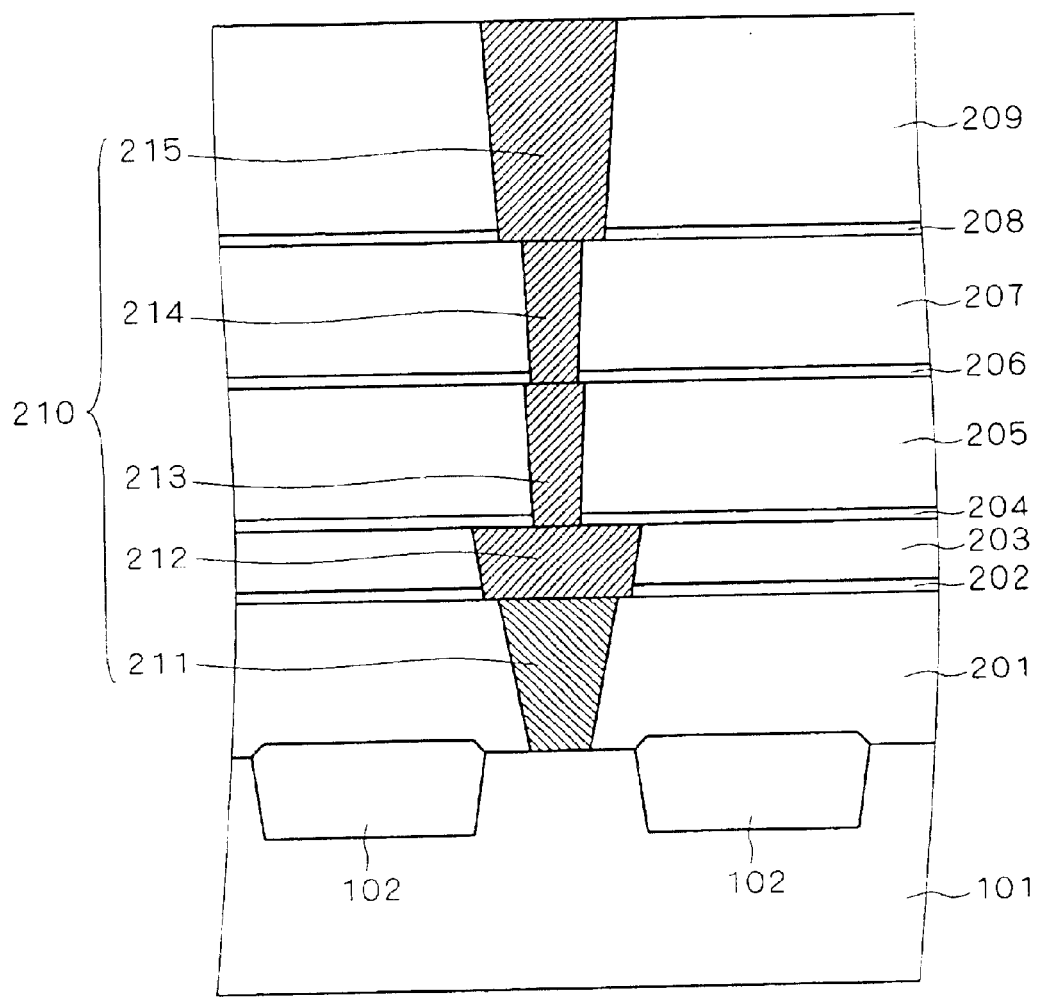

FIGS. 26 through 28 are views for illustrating processes of manufacturing the semiconductor device illustrated in FIG. 25. Below, the processes of manufacturing the semiconductor device will be described with reference to those figures.

First, the interlayer insulating film 201, the etch stop layer 202, the interlayer insulating film 203, the first contact 211 and the first interconnect layer 212 are formed on the silicon substrate 101 having the isolation film 102 formed therein. Processes of forming the foregoing elements are the same as those in the first preferred embodiment, and detailed description therefor will be omitted in the sixth preferred embodiment.

Next, the etch stop layer 204 made of plasma nitride, for example, is formed, and subsequently the interlayer insulating film 205 made of plasma oxide, for example, is formed. Thereafter, a resist mask 221 having an opening which is located at a portion where the second contact 213 is to be formed is formed on the interlayer insulating film 205. Then, dry etching is performed using the resist mask 221 as a mask, to form an opening for forming the second contact 213 (FIG. 26). After the resist mask 221 is removed, a trench for forming an interconnect is formed in the circuit region. During formation of the trench, the area in which the seal ring 210 is formed is maintained with no process being performed thereon.

Then, a barrier metal (not shown) is formed, and copper is deposited by a plating process. Subsequently, respective portions of the barrier metal and the copper which are present on the interlayer insulating film 205 are removed by a CMP process, to complete the second contact 213 in the interlayer insulating film 205 (FIG. 27). In this manner, the second contact 213 can be formed by only a contact forming step in a flow of an entire dual damascene process.

After that, the etch stop layer 206, the interlayer insulating film 207 and the third contact 214 are formed in the same manner as described above, i.e., by only a contact forming step in a flow of an entire dual damascene process. Further, the etch stop layer 208, the interlayer insulating film 209 and the fourth contact 215 are formed on the resultant structure (FIG. 28). By the foregoing processes, the seal ring 210 is completed.

Then, the passivation film 120 is formed by the same processes as described in the first preferred embodiment, thereby to complete the semiconductor device according to the sixth preferred embodiment.

As described above, according to the sixth preferred embodiment, predetermined layers (the second, third and fourth contacts 213, 214 and 215) included in the seal ring 210 are formed by only a contact forming step in a flow of an entire dual damascene process. Thus, a process sequence of the sixth preferred embodiment dose not include alignment between the interconnect layers and the contacts of the seal ring 210, which should be included in a process sequence employing both a contact forming step and a step of forming an interconnect in a flow of an entire dual damascene process. Accordingly, there is no need to provide a margin for misalignment between the interconnect layers and the contacts of the seal ring 210 in the sixth preferred embodiment. As a result, the width of the seal ring 210 can be reduced as compared to that in any other preferred embodiments.

In the above description, some of the layers included in the seal ring 210 are formed by only a contact forming step in a flow of an entire dual damascene process. However, all the layers included in the seal ring 210 may be formed by only a contact forming step in a flow of an entire dual damascene process, depending on a process sequence for forming a contact and an interconnect in the circuit region.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a seal ring formed in a vicinity of an edge portion of a semiconductor chip so as to surround a circuit region of said semiconductor chip;

a first passivation film formed above said seal ring so as to cover a surface of said semiconductor chip, said first passivation film having a first opening reaching a top face of an uppermost layer of said seal ring;

an aluminum interconnect layer formed in said first opening; and a second passivation film formed so as to cover said first passivation film and said aluminum interconnect layer, said second passivation film having an etch selectivity relative to said first passivation film, wherein said second passivation film has a second opening reaching a top face of said first passivation film, and said second opening does not penetrate said first passivation film.

2. The semiconductor device according to claim 1, wherein said uppermost layer of said seal ring is made of copper.

* * * * *